US010672445B2

(12) United States Patent
O et al.

(10) Patent No.: US 10,672,445 B2
(45) Date of Patent: Jun. 2, 2020

(54) MEMORY DEVICE INCLUDING LOCAL SUPPORT FOR TARGET DATA SEARCHING AND METHODS OF OPERATING THE SAME

(71) Applicant: Samsung Electronics Co., Ltd., Suwon-si, Gyeonggi-do (KR)

(72) Inventors: Seong Il O, Suwon-si (KR); Jun Hyung Kim, Suwon-si (KR); Kyo Min Sohn, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/032,768

(22) Filed: Jul. 11, 2018

(65) Prior Publication Data
US 2019/0206460 A1 Jul. 4, 2019

(30) Foreign Application Priority Data

Jan. 3, 2018 (KR) ........................ 10-2018-0000640

(51) Int. Cl.
*G11C 11/4096* (2006.01)
*G11C 8/18* (2006.01)
*G11C 8/12* (2006.01)
*G11C 7/06* (2006.01)
*G11C 7/10* (2006.01)
(Continued)

(52) U.S. Cl.
CPC ................ *G11C 8/18* (2013.01); *G11C 7/062* (2013.01); *G11C 7/065* (2013.01); *G11C 7/106* (2013.01); *G11C 7/1006* (2013.01); *G11C 7/1045* (2013.01); *G11C 8/12* (2013.01); *G11C 11/4093* (2013.01); *G11C 11/4096* (2013.01); *G11C 29/18* (2013.01); *G11C 2207/2272* (2013.01)

(58) Field of Classification Search
CPC ........ G11C 8/18; G11C 15/04; G11C 11/4096
See application file for complete search history.

(56) References Cited

U.S. PATENT DOCUMENTS 7,164,287 B2    1/2007   Ueno
7,493,531 B2    2/2009   Ito et al.
(Continued)

FOREIGN PATENT DOCUMENTS

KR    1020010063184    7/2001
KR    10-0656717       12/2006
(Continued)

*Primary Examiner* — Amir Zarabian
*Assistant Examiner* — Jay W. Radke
(74) *Attorney, Agent, or Firm* — Sughrue Mion, PLLC

(57) ABSTRACT

A memory device can include a plurality of memory banks coupled to an input/output bus and a memory controller coupled to the plurality of memory banks. The memory controller can be configured to control operations of the plurality of memory banks, where each of the plurality of memory banks can include a bank array including a plurality of memory cells configured to store data, a latch circuit coupled to the input/output bus, where the latch circuit can be configured to store target data received via the input/output bus to provide stored target data, and a comparison circuit coupled to the latch circuit, where the comparison circuit can be configured to compare stored data output by the bank array with the stored target data to provide result data to the memory controller.

19 Claims, 18 Drawing Sheets

(51) Int. Cl.
*G11C 11/4093* (2006.01)
*G11C 29/18* (2006.01)

(56) References Cited

U.S. PATENT DOCUMENTS

| | | | |
|---|---|---|---|
| 7,984,363 B2 | 7/2011 | Kushida | |
| 8,238,140 B2 | 8/2012 | Yoshimoto et al. | |
| 8,467,213 B1 * | 6/2013 | Channabasappa | G11C 5/14 365/49.1 |
| 9,627,015 B2 | 4/2017 | Sohn et al. | |
| 2006/0069896 A1 * | 3/2006 | Sanders | G11C 5/04 711/168 |
| 2007/0255983 A1 | 11/2007 | Funaba et al. | |
| 2010/0318729 A1 * | 12/2010 | Himeno | G11C 11/5628 711/103 |
| 2015/0279466 A1 | 10/2015 | Manning | |

FOREIGN PATENT DOCUMENTS

| | | |
|---|---|---|
| KR | 10-0702976 | 4/2007 |
| KR | 10-1569540 | 11/2015 |

\* cited by examiner

MEMORY DEVICE INCLUDING LOCAL SUPPORT FOR TARGET DATA SEARCHING AND METHODS OF OPERATING THE SAME

CROSS REFERENCE TO RELATED APPLICATION

This application claims benefit of priority to Korean Patent Application No. 10-2018-0000640 filed on Jan. 3, 2018 in the Korean Intellectual Property Office, the disclosure of which is incorporated herein by reference in its entirety.

FIELD

The present inventive concept relates to a memory device and an operating method thereof.

BACKGROUND

As the amount of data processed by memory devices has increased, a technique of processing part of an operation performed in a processor, in a memory device connected to the processor, has been developed.

SUMMARY

In some embodiments, a memory device can include a plurality of memory banks coupled to an input/output bus and a memory controller coupled to the plurality of memory banks. The memory controller can be configured to control operations of the plurality of memory banks, where each of the plurality of memory banks can include a bank array including a plurality of memory cells configured to store data, as stored data, a latch circuit coupled to the input/output bus, where the latch circuit can be configured to store target data, as stored target data, received via the input/output bus to provide the stored target data, and a comparison circuit coupled to the latch circuit, wherein the comparison circuit can be configured to compare the stored data output by the bank array with the stored target data output by the latch circuit to provide result data to the memory controller.

In some embodiments, a memory device can include a plurality of memory banks coupled to an input/output bus, where each of the plurality of memory banks can include a respective bank array having a plurality of memory cells to store data as stored data, a latch circuit configured to store target data as stored target data, a comparison circuit, coupled to the latch circuit and to a data transmission path of the bank array. The memory device can further include a memory controller configured to perform a writing operation to store the target data in the plurality of memory banks and configured to perform a reading operation to retrieve the stored data from the plurality of memory banks in response to a comparison operation command transmitted from an external processor. The memory controller can be further configured to control the plurality of memory banks such that the latch circuit stores the stored target data in response to the writing operation and can be configured to cause the stored data to be compared with the stored target data in the latch circuit in response to the comparison operation command transmitted from the external processor to generate result data.

In some embodiments, a memory device can include a plurality of memory banks coupled to an input/output bus, where each of the plurality of memory banks can include a bank array including a plurality of memory cells, a data transmission path coupled to the bank array, a latch circuit coupled to the data transmission path, and a comparison circuit coupled to the data transmission path. The memory device can further include a memory controller configured to control the plurality of memory banks, in response to a comparison operation command and target data received from an external processor, to perform a writing operation simultaneously to the plurality of memory banks to store the target data in each respective latch circuit and to perform a reading operation to the plurality of memory banks to compare respective stored data retrieved from the bank array with the target data stored in the latch circuit to generate result data.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
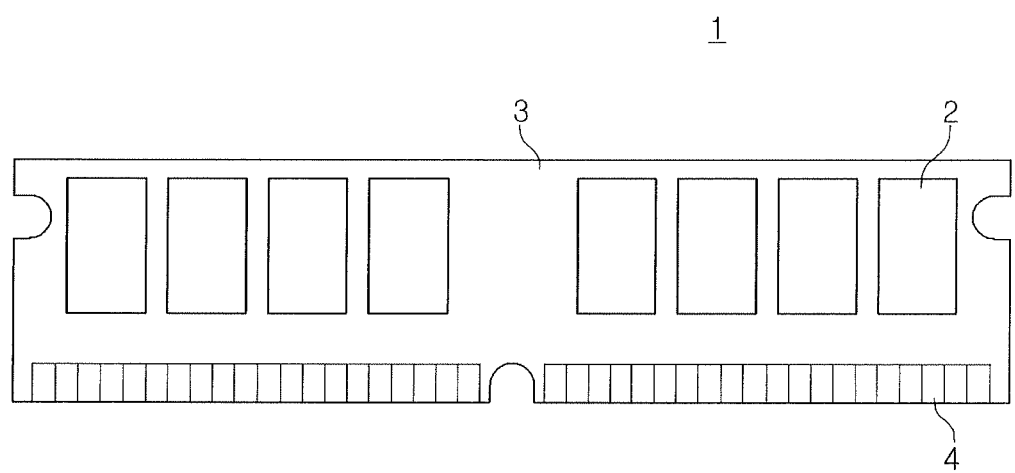
FIG. 1 is a view illustrating a memory module according to an example embodiment of the present inventive concept.

FIG. 1 is a block diagram illustrating a memory module according to an example embodiment of the present inventive concept.

Referring to FIG. 1, a memory module 1 according to an example embodiment of the present inventive concept may include a plurality of memory chips 2, a substrate 3 on which the plurality of memory chips 2 are mounted, and the like. Input/output pins 4 for exchanging data may be provided (at least) at one end of the substrate 3. The plurality of memory chips 2 may receive data to be stored through the input/output pins 4 or may output data through the input/output pins 4. FIG. 1 illustrates a memory module 1 including eight memory chips 2, but the number of memory chips 2 may vary, depending on data storage capacity to be offered by the memory module 1 or data storage capacity of each of the memory chips 2, and the like. An input/output (I/O) bus connected to the memory chips 2 and the input/output pins 4 may be provided in the substrate 3, and the memory chips 2 may share the I/O bus.

Figure 2:
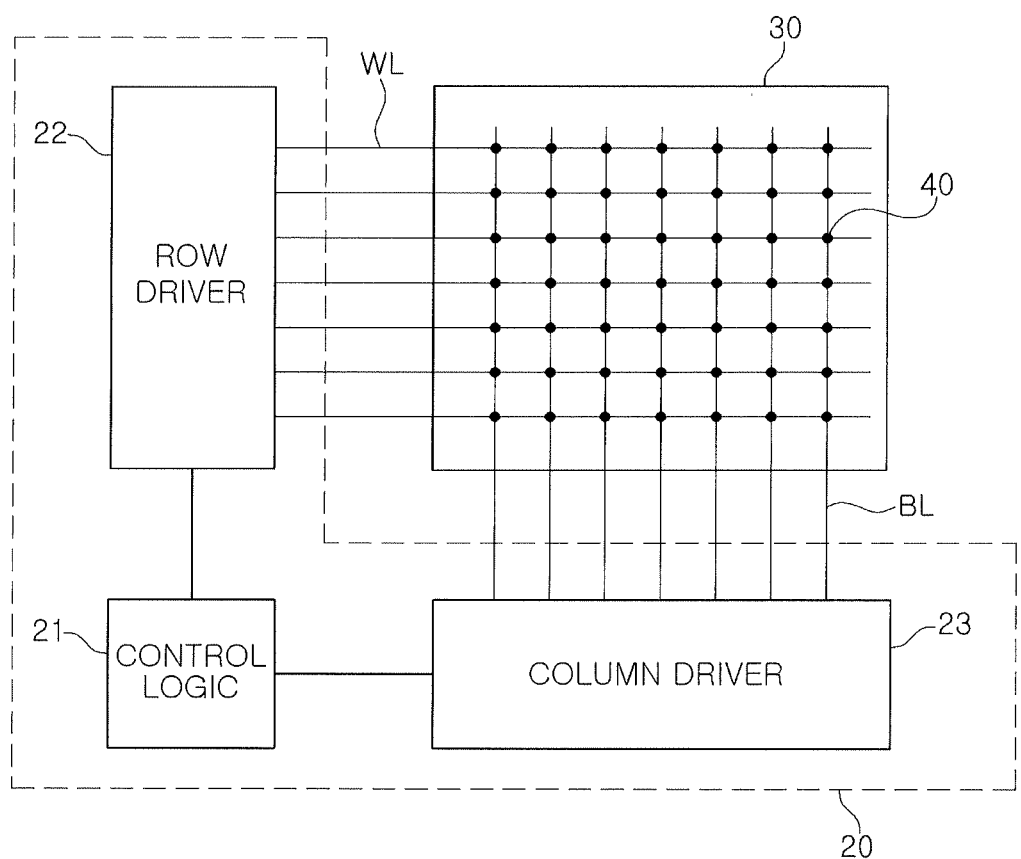
FIG. 2 is a block diagram of a memory device according to an example embodiment of the present inventive concept.

FIG. 2 is a block diagram schematically illustrating an internal structure of a memory device 10. The memory device 10 according to an example embodiment illustrated in FIG. 2 may be employed as the plurality of memory chips 2 included in the memory module 1 in the example embodiment illustrated in FIG. 1. Referring to FIG. 2, the memory device 10 according to an example embodiment of the present inventive concept may include a memory controller 20 and a bank array 30. In an example embodiment, the memory controller 20 may include a control logic 21, a row driver 22, a column driver 23, and the like. The bank array 30 may include a plurality of memory cells 40.

In an example embodiment, the row driver 22 may be connected to the memory cells 40 via word lines WL and the column driver 23 may be connected to the memory cells 40 via bit lines BL. In an example embodiment, the row driver 22 may select a memory cell MC to write data to or a memory cell MC to read data from, and the column driver 23 may include a write/read circuit which writes data into a memory cell MC or which reads data from a memory cell MC. Operations of the row driver 22 and the column driver 23 may be controlled by the control logic 21.

Figure 3:
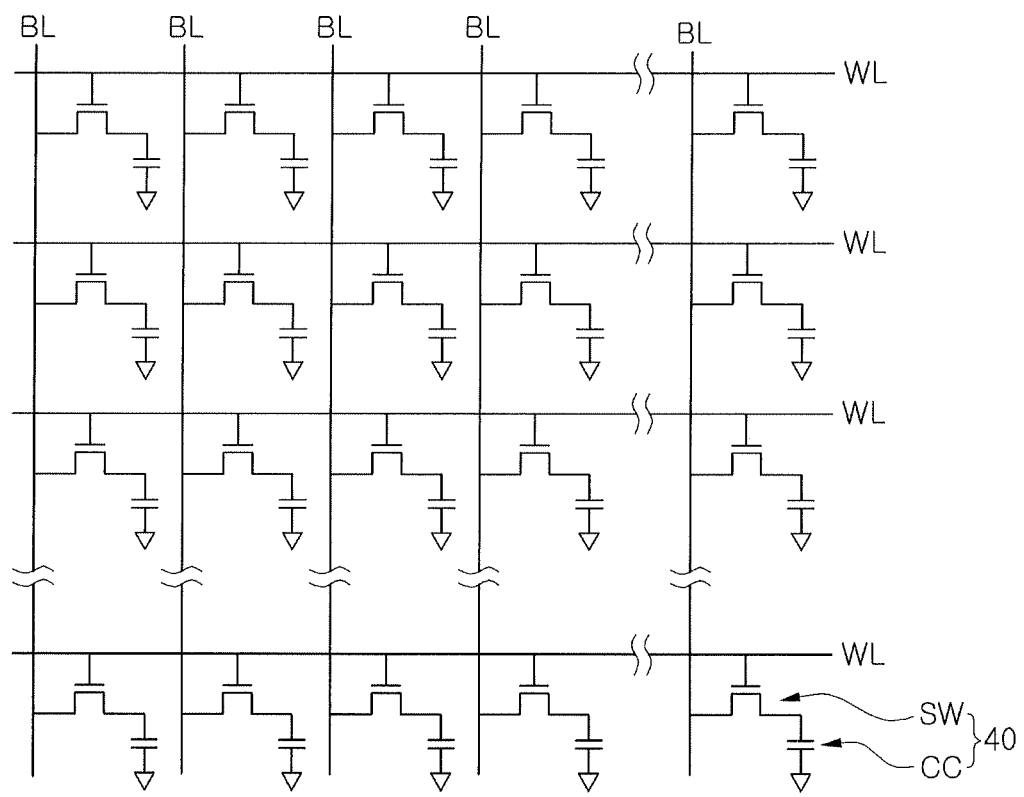
FIG. 3 is a view illustrating a bank array included in a memory device according to an example embodiment of the present inventive concept.

FIG. 3 is a view illustrating a bank array included in a memory device according to an example embodiment of the present inventive concept.

Referring to FIG. 3, the bank array 30 according to an example embodiment of the present inventive concept may include a plurality of memory cells 40. The memory cells 40 may be provided at points at which a plurality of word lines WL and a plurality of bit lines BL intersect each other. That is, each of the memory cells 40 may be connected to one word line WL and one bit line BL.

Each of the memory cells 40 may include a switching element SW and an information storage capacitor CC. In an example embodiment, the switching element SW may include a transistor, a gate terminal of the transistor may be connected to the word line WL and the drain/source terminals of the transistor may be connected to the bit line BL and the information storage capacitor CC, respectively.

The memory controller 20 may write or erase data by charging the information storage capacitor CC included in each of the plurality of memory cells 40 or discharging the information storage capacitor (CC) through the plurality of word lines WL and the plurality of bit lines BL. Also, the memory controller 20 may read data from each of the plurality of memory cells 40 by reading a voltage, or the like, of the information storage capacitor CC. In an example embodiment, the memory controller 20 may perform a refresh operation to rewrite data to the plurality of memory cells 40 so that data may not be lost as the charges stored in the information storage capacitor CC are naturally discharged.

Figure 4:
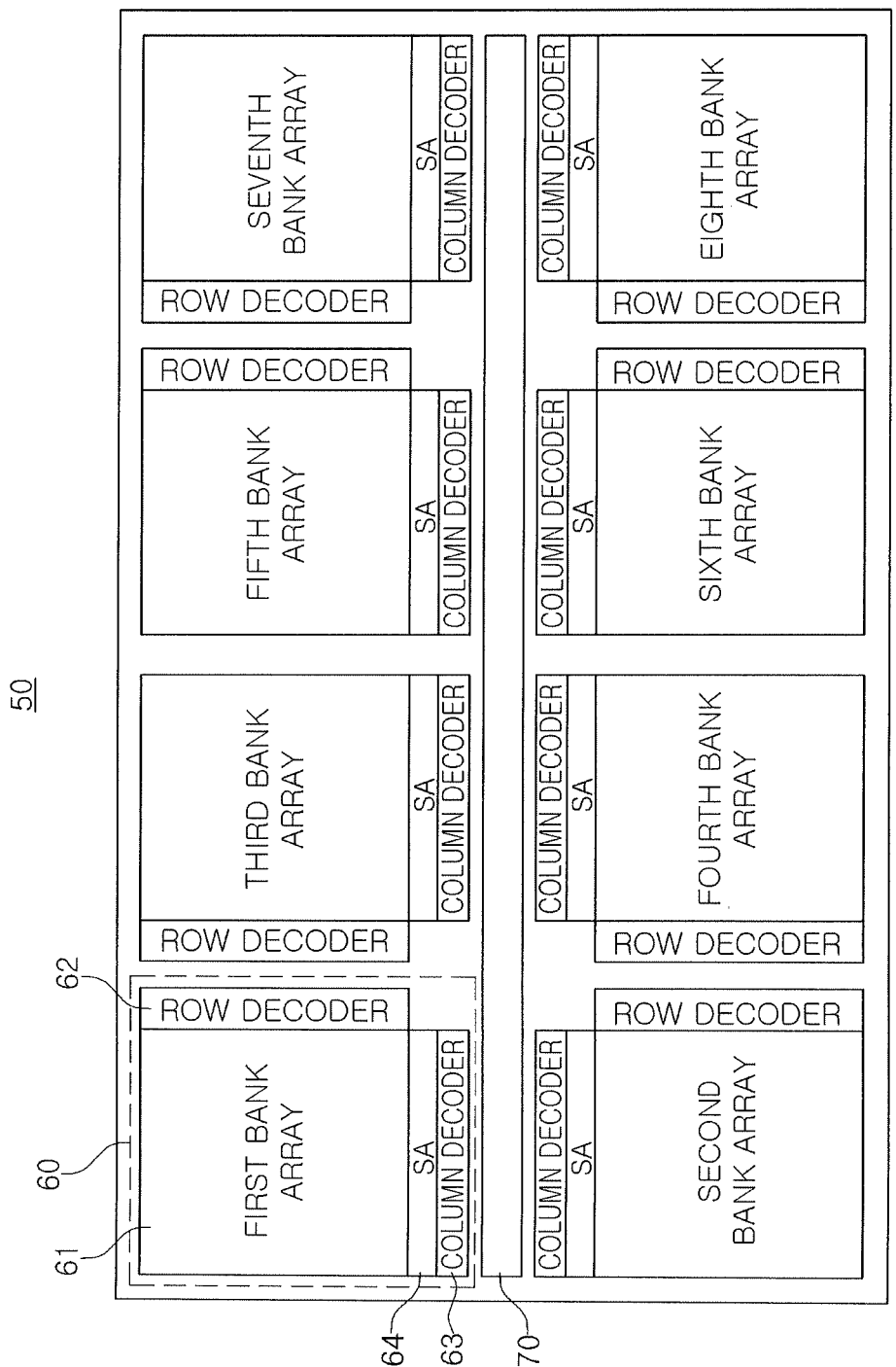
FIG. 4 is a view schematically illustrating a structure of a memory device included in a memory module according to an example embodiment of the present inventive concept.

FIG. 4 is a view schematically illustrating a structure of a memory chip included in a memory device according to an example embodiment of the present inventive concept. Referring to FIG. 4, a memory device 50 according to an example embodiment of the present inventive concept may include a memory bank 60 and a logic circuit 70. The memory bank 60 may include a bank array 61 having a plurality of memory cells, a row decoder 62, a column decoder 63, and a sense amplifier (SA) 64. In an example embodiment, the memory device 50 may include a plurality of memory banks 60.

The plurality of memory banks 60 included in the memory device 50 may share a logic circuit 70. The logic circuit 70 may read data from the bank array 61, designate an address to store data in the bank array 61, or determine an operation mode of the memory device 50. The logic circuit 70 may include input/output pads for receiving data to be stored in the plurality of memory banks 60 and for transmitting data output from the plurality of memory banks 60.

In an example embodiment, the memory device 50 may exchange data with an external processor via the input/output pads of the logic circuit 70. In a case in which the processor performs a comparison operation to determine whether target data searched by the processor is present in the memory device 50, generally, the processor receives stored data output from any one of the plurality of memory banks 60 and compares the received stored data with the target data within the processor.

In this method, the processor may only receive the stored data output from one of the plurality of memory banks 60 at a time. Also, the processor may store the stored data received from the memory bank 60 in a cache memory thereof, and if the stored data does not match the target data, the processor may need to delete the stored data stored in the cache memory before receiving a new stored data from the memory bank 60. Therefore, it may take a significantly long time to specify the memory bank 60 in which the target data exists and an address at which the target data is stored in a conventional approach.

In an example embodiment of the present inventive concept, a memory bank 60 in which the target data to be searched by the processor exists and a comparison operation for specifying the address may be performed within the memory device 50. For example, each of the plurality of memory banks 60 included in the memory device 50 may receive target data from the processor, and compare the target data with the stored data output by the bank array 61. Furthermore, in an example embodiment of the present inventive concept, since the plurality of memory banks 60 may simultaneously compare the stored data with the target data, the time used for the comparison operation may be reduced, and an operation speed of the memory device 50 may be improved.

In order for the plurality of memory banks 60 to perform the comparison operation, each of the memory banks 60 according to an example embodiment of the present inventive concept may include a latch circuit for storing the target data and a comparison circuit, and the like. The latch circuit and the comparison circuit may be connected to a data transmission path between the input/output pad and the bank array 61. It will be understood that the latch circuit can be any circuit that enables fast access to the data provided by the processor in support of the comparison operation. Furthermore, as appreciated by the present inventors, the comparison operation can be replaced with any frequently used operation which can be supported locally within the memory device 50 in some embodiments.

Figure 5:
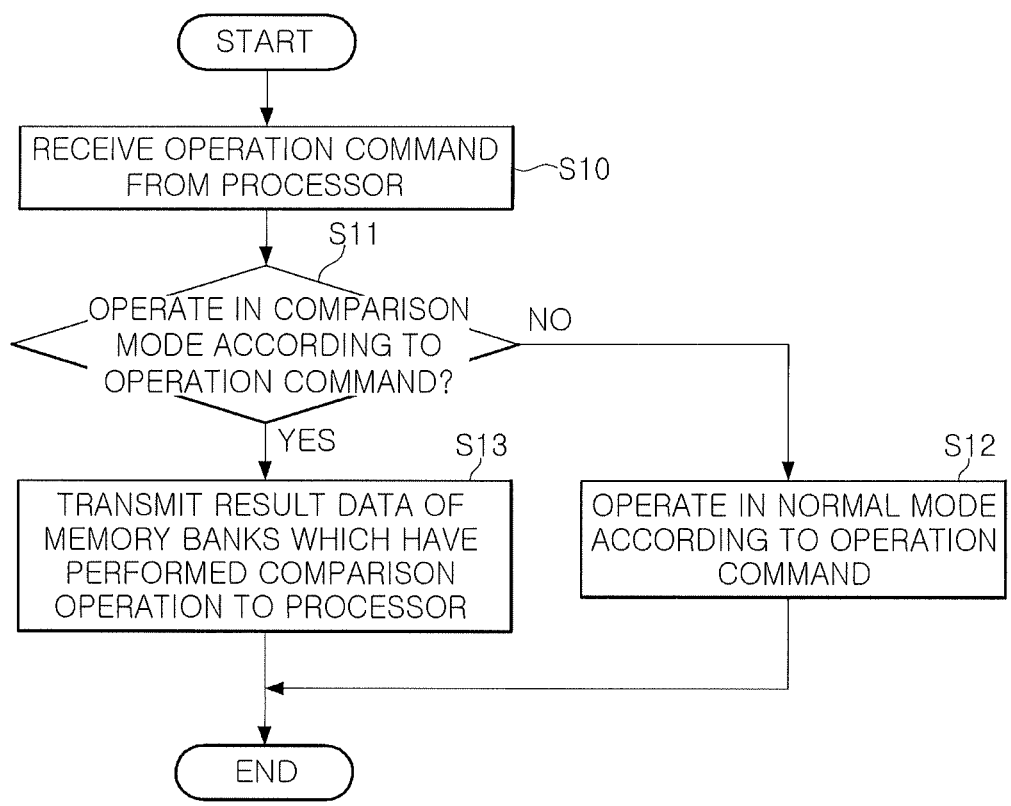
FIG. 5 is a flowchart illustrating an operation of a memory device according to an example embodiment of the present inventive concept.

FIG. 5 is a flowchart illustrating an operation of a memory device according to an exemplary example embodiment of the present inventive concept.

Referring to FIG. 5, an operation of the memory device 50 according to an example embodiment of the present inventive concept may begin as a memory device 50 receives an operation command from a processor (S10). In an example embodiment, the operation command that the processor sends to the memory device 50 may include a mode register set (MRS) for controlling an operation mode of the memory device. The memory device 50 may decode the mode register set transmitted from the processor to set various operating characteristics such as a burst length.

The memory device 50 according to an example embodiment of the present inventive concept may analyze the operation command received from the processor to determine whether it must operate in a comparison mode (S11). The comparison mode may be an operation mode in which a data comparison operation for determining whether the target data searched by the processor exists in the memory device, and/or whether in any of the plurality of memory banks included in the memory device 50 the target data exists, and the like, is performed internally in the memory device.

If it is determined in the step of S11 that the memory device 50 is not operating in the comparison mode, the memory device 50 may operate according to the operation command in a normal mode (S12). For example, the memory device 50 may decode the mode register set received together with the operation command to set operating characteristics of the memory device 50 and perform operations such as data write, data read, data refresh, data delete, and the like.

Meanwhile, if it is determined in the step of S11 that the memory device 50 is operating in the comparison mode, the memory device 50 may transmit result data of the memory banks which have performed the comparison operation to the processor (S13). In the comparison mode, the memory device 50 may receive the target data to be searched by the processor and address information for searching for the target data. The memory device 50 may store the target data in the latch circuit in each of the memory banks and may compare stored data output from a respective bank array based on the address included in the address information with the target data.

Assuming that a burst length of the memory device 50 is 8 bits per memory bank and the memory device 50 writes or reads 64 bits of data in a single write/read command, each of the plurality of memory banks included in the memory device 50 compares 64 bits of target data with the 64 bits of stored data. In an example embodiment, each of the plurality of memory banks may generate and output result data, wherein the result data may be 8 bits of data generated by comparing the 64 bits of target data with the 64 bits of stored data. The memory device 50 may merge the result data generated by comparing the target data with the stored data simultaneously by a maximum of eight memory banks into output data and transmit the output data to the processor. Thus, the speed of the comparison operation for searching for the memory bank where the target data desired by the processor exists and the address where the target data is stored may be significantly improved.

Meanwhile, unlike the example embodiment described above with reference to FIG. 5, the memory banks included in the memory device 50 may perform the comparison operation without the process of operating in the normal mode based on the operation command received from the processor. In an example embodiment, by adding a control command for controlling each of the memory banks to execute the operation of comparing the target data and the stored data to generate result data to the memory device, the memory device 50 may operate in the comparison mode without intervention of the mode register set. In order to operate in the comparison mode without intervention of the mode register set, a control command for storing the target data in the latch circuit and a control command for comparing the target data stored in the latch circuit with stored data may be supported by the memory device.

Figure 6:
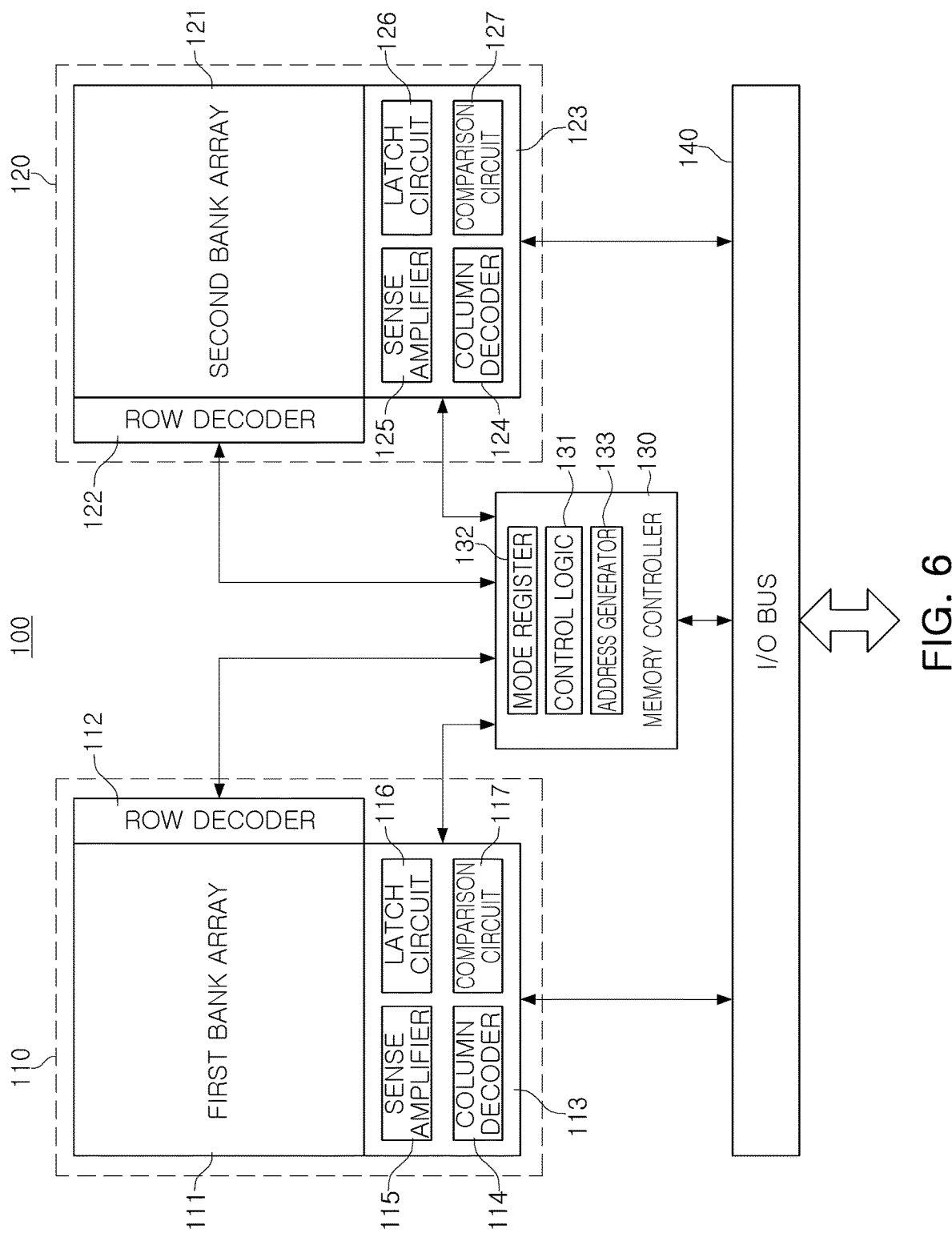
FIGS. 6 through 8 are block diagrams illustrating an operation of a memory device according to an example embodiment of the present inventive concept.
Figure 7:
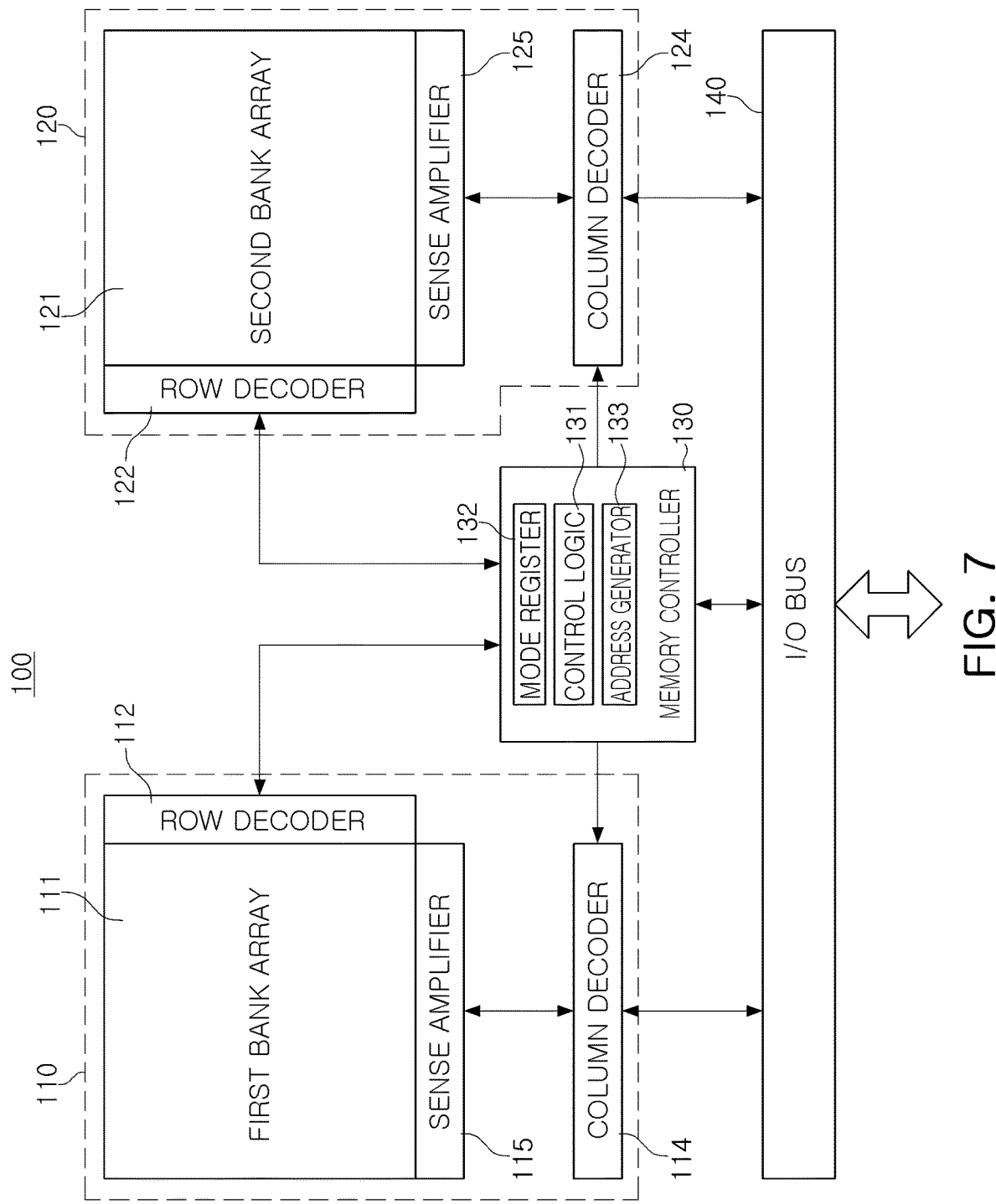
Figure 8:
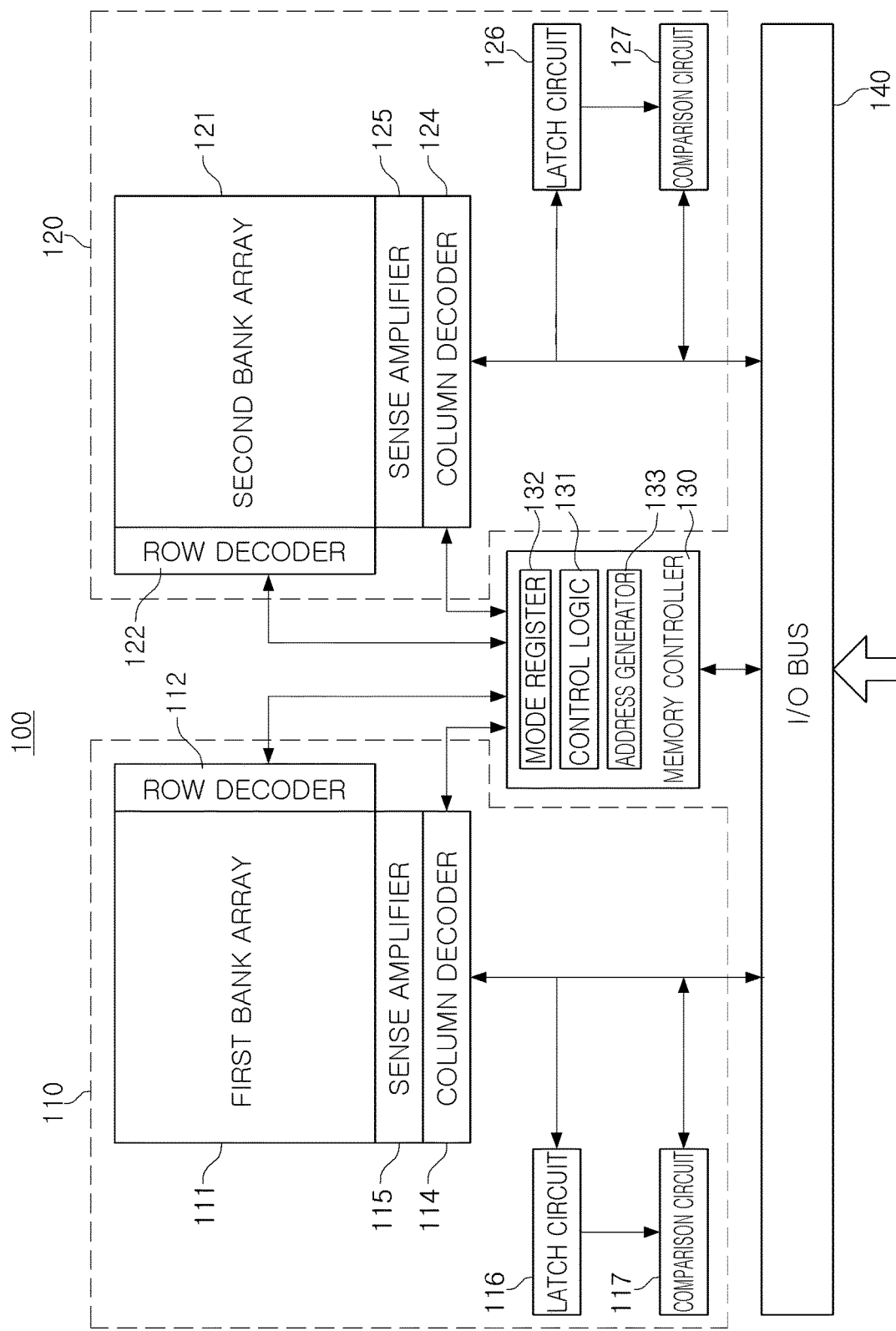

FIGS. 6 through 8 are block diagrams provided to illustrate an operation of a memory device according to an example embodiment of the present inventive concept.

Referring to FIG. 6, the memory device 100 according to an example embodiment of the present inventive concept includes a first memory bank 110, a second memory bank 120, a memory controller 130, and an I/O bus 140. The first memory bank 110 and the second memory bank 120 may share the I/O bus 140.

The first memory bank 110 and the second memory bank 120 may have the same structure. The first memory bank 110 includes a first bank array 111 having a plurality of memory cells for storing data, a row decoder 112, and a read/write circuit 113. The read/write circuit 113 may include a column decoder 114, a sense amplifier 115, a latch circuit 116, and a comparison circuit 117. The row decoder 112 may be coupled to a plurality of memory cells via word lines and the read/write circuit 113 may be coupled to a plurality of memory cells via bit lines. Data that the read/write circuit 113 is to store in the first bank array 111 and data that the read/write circuit 113 reads from the first bank array 111 may be transferred via the I/O bus 140.

The memory controller 130 may include a control logic 131, a mode register 132, an address generator 133, and the like. The control logic 131 may control an operation of the mode register 132, the address generator 133, the first memory bank 110, and the second memory bank 120.

The mode register 132 decodes a mode register set received from an external processor via the I/O bus 140 and determines various operational characteristics including a burst length, a read burst type, a comparison mode, DLL reset, and a DLL enable state of the memory device 100. In an example embodiment of the present inventive concept, when a comparison operation command is included in the mode register set decoded by the mode register 132, the control logic 131 may operate the memory device 100 in the comparison mode. In the comparison mode, the latch circuits 116 and 126 and the comparison circuits 117 and 127, respectively included in the first and second memory banks 110 and 120, may be activated.

The address generator 133 may generate an address to store data or an address from which the read/write circuits 113 and 123 read the data, using address information received from the external processor via the I/O bus 140. The address generated by the address generator 133 may be transmitted to the row decoders 112 and 122 and the column decoders 114 and 124.

FIG. 7 is a block diagram provided to illustrate an operation of the memory device 100 in the normal mode, rather than the comparison mode. Referring to FIG. 7, when the memory device 100 operates in the normal mode, the latch circuits 116 and 126 and the comparison circuits 117 and 127 respectively included in the first and second memory banks 110 and 120 may be deactivated.

When a writing operation command and write data to be stored in the memory device 100 are received from the processor, the memory controller 130 may store the data in the first bank array 111 and/or the second bank array 121. The write data may be stored in the first bank array 111 and/or the second bank array 121 through the column decoders 114 and 124 and the sense amplifiers 115 and 125.

Meanwhile, when a reading operation command is received from the processor, the memory controller 130 may generate output data using stored data output from the first bank array 111 and/or the second bank array 121. The output data may be transferred to the processor via the I/O bus 140. An address to store or read data in the writing operation and the reading operation may be acquired by decoding the address information received from the processor together with the writing operation command and the reading operation command by the address generator 133.

FIG. 8 is a block diagram provided to illustrate an operation of the memory device 100 in the comparison mode. Referring to FIG. 8, when the memory device 100 is operating in the comparison mode, the latch circuits 116 and 126 and the comparison circuits 117 and 127 respectively included in the first and second memory banks 110 and 120 may be activated.

When the processor transmits a mode register set including a comparison operation command, the mode register 132 may decode the mode register set and the control logic 131 may set the memory device 100 to the comparison mode. When the mode register 132 decodes the mode register set including the comparison operation command and the memory device 100 enters the comparison mode, an operation of the memory device 100 based on the writing operation command and the reading operation command transmitted from the processor may differ from the normal mode. Accordingly, the comparison operation may be realized in the memory device 100, while minimizing a change in design of the memory controller 130.

When the processor transmits the writing operation command while the memory device 100 is in the comparison mode, the memory controller 130 may store target data received together with the writing operation command in the latch circuits 116 and 126, rather than in the first and second bank arrays 111 and 121. In an example embodiment, the memory controller 130 may store the target data in the latch circuits 116 and 126 using a multiplexer connected to respective data transmission paths of the first and second memory banks 110 and 120.

When the processor transmits a reading operation command while the memory device 100 is in the comparison mode, the memory controller 130 may transfer stored data output from each of the first and second bank arrays 111 and 121 to the comparison circuits 117 and 127, rather than to the I/O bus 140. The comparison circuits 117 and 127 may compare the stored data output from the first and second bank arrays 111 and 121 with the target data stored in the latch circuits 116 and 126 and output result data including a comparison result, respectively. The memory controller 130 may merge the result data output from the comparison circuits 117 and 127 to generate output data and transmit the output data to the processor via the I/O bus 140.

In an example embodiment of the present inventive concept, a comparison operation of determining whether the target data to be searched by the processor is present in the memory device 100 and determining where the target data exists in the first and second memory banks 110 and 120 may be performed by the memory device 100. While the memory device 100 is set in the comparison mode, the processor may transmit the target data along with the writing operation command, and thereafter, transmit the reading operation command. In response to the writing operation command, the memory device 100 set in the comparison mode may store the target data in the latch circuits 116 and 126, rather than in the bank arrays 111 and 121. In addition, in response to the reading operation command, the comparison circuits 117 and 127 may receive stored data output from the bank arrays 111 and 121 and compare the stored data with the target data stored in the latch circuits 116 and 126. Thus, the comparison operation to search for the target data in each of the first and second memory banks 110 and 120 may be performed simultaneously in the first and second memory banks 110 and 120, and thus, an operation speed may be improved.

In an example embodiment of the present inventive concept, the operation of the memory device 100 according to the writing operation command and the reading operation command while the memory device 100 is set in the comparison mode may be variously modified. For example, in response to a writing operation command, the memory device 100 may simultaneously store the target data in the latch circuits 116 and 126 or sequentially store the target data in the latch circuits 116 and 126. Also, in response to a reading operation command, the memory device 100 may simultaneously update the data stored in the latch circuits 116 and 126 with the stored data output from the bank arrays 111 and 121 or sequentially update the data stored in the latch circuits 116 and 126 with the stored data output from the bank arrays 111 and 121.

For an operation such as that described above, the memory device 100 may be further include first and second input/output pins. In an example embodiment, the first input/output pin may be a pin for receiving an instruction to determine whether to operate the latch circuits 116 and 126 simultaneously in response to a write/reading operation command. The second input/output pin may be a pin for determining a source of new data for updating the data stored in the latch circuits 116 and 126. The information received via the second input/output pin may indicate whether the data for updating the data stored in the latch circuits 116 and 126 is target data transferred from the processor or stored data output from the bank arrays 111 and 121.

FIGS. 9 through 13 are views provided to explain operations of a memory device in a comparison mode according to an example embodiment of the present inventive concept.

Figure 9:
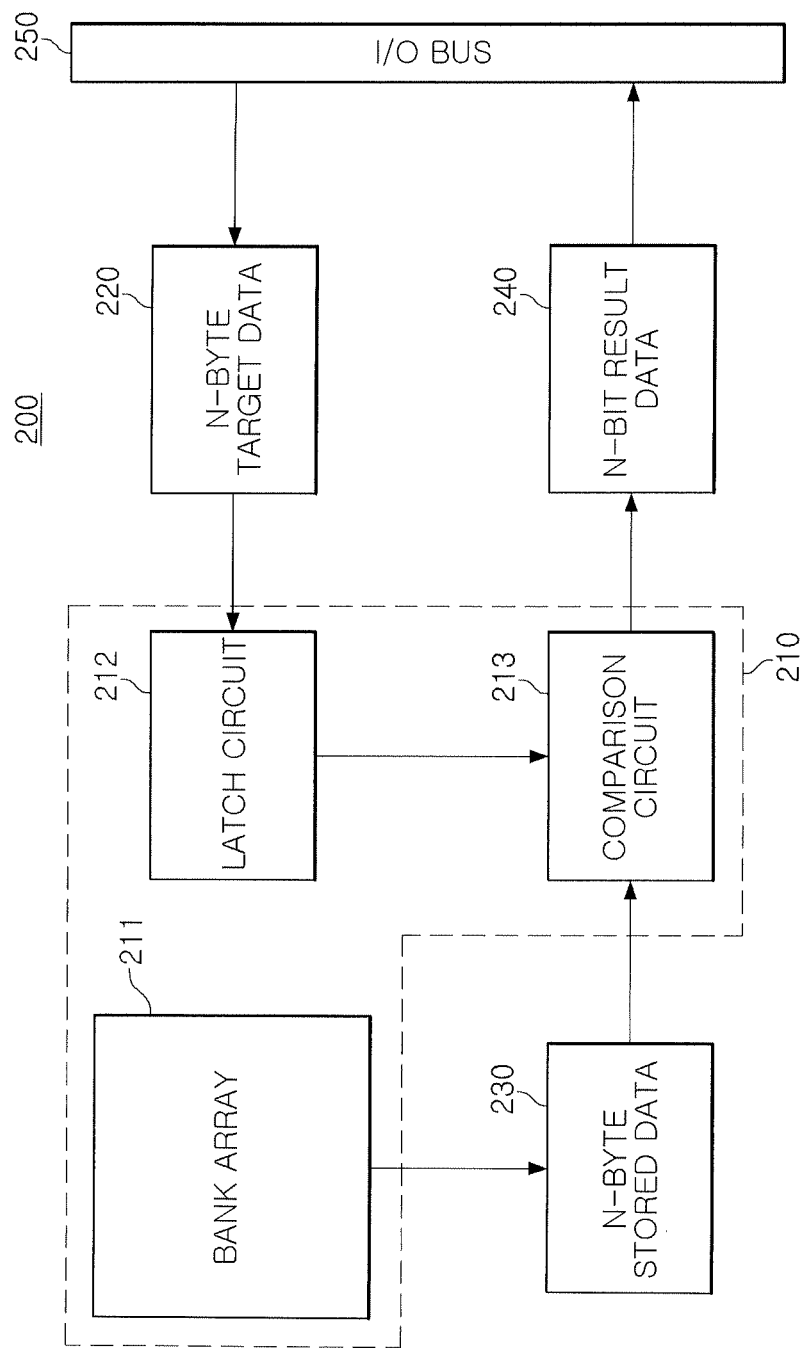
FIGS. 9 through 13 are views illustrating operations of a memory device in a comparison mode according to an example embodiment of the present inventive concept.

FIG. 9 is a view provided to explain a comparison operation performed by a memory bank 210 included in the memory device 200 set in the comparison mode. Referring to FIG. 9, the memory device 200 may receive N-byte (N is a natural number) target data 220 along with a writing operation command via an I/O bus 250 in the comparison mode. As described above, the memory device 200 set in the comparison mode may store the target data 220 received together with the writing operation command in the latch circuit 212, instead of the bank array 211. The latch circuit 212 may have sufficient capacity to store the N-byte target data 220 and, here, N may be determined by a burst size of the memory device 200.

When a reading operation command is received via the I/O bus 250 in the comparison mode, the memory device 200 may transmit the N-byte stored data 230 output from the bank array 211 to the comparison circuit 213. The comparison circuit 213 may compare the stored data 230 with the target data 220 stored in the latch circuit 212 to generate N-bit result data 240. In an example embodiment, the comparison circuit 213 may XOR the target data 220 and the stored data 230 to produce the result data 240.

The comparison circuit 213 may compare the target data 220 and the stored data 230 in units of bytes. When the target data 220 and the stored data 230 have a size of 8 bytes, the result data 240 generated through the comparison operation on a byte basis may have a size of 8 bits. Assuming that a maximum size of data that may be transmitted via the I/O bus 250 in response to one operation command is 8 bytes, the memory device 200 may merge up to eight pieces of result data 240 and transmits the merged data, as output data, to the processor. Here, pieces of result data 240 merged as output data may be generated by different memory banks 210 or may be generated by performing a plurality of comparison operations in one memory bank 210.

Figure 10:
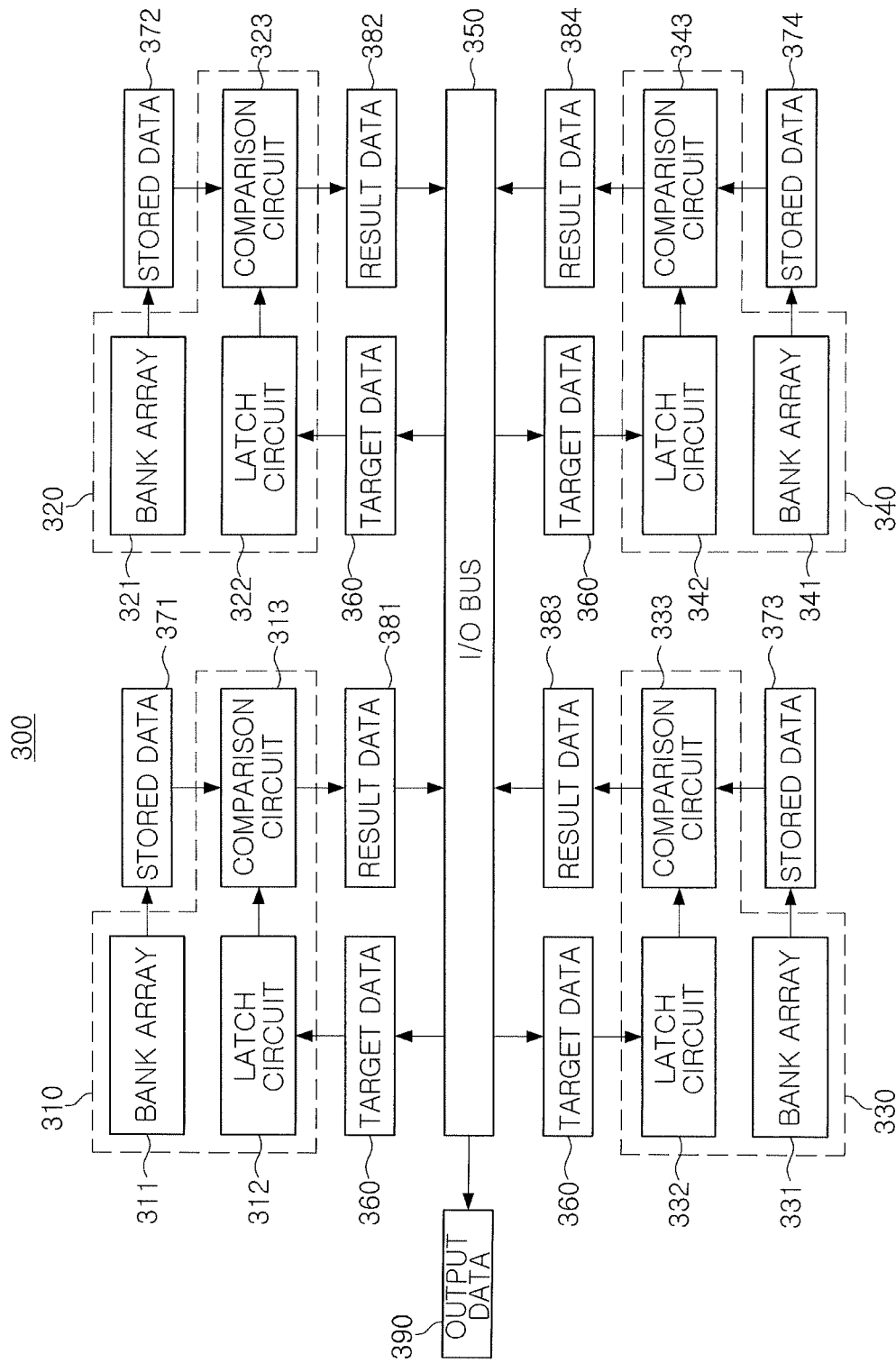

Referring to FIG. 10, a memory device 300 may include a plurality of memory banks 310 to 340 and the plurality of memory banks 310, 320, 330, and 340 may share an I/O bus 350. The plurality of memory banks 310, 320, 330, and 340 may include bank arrays 311, 321, 331 and 341, latch circuits 312, 322, 332 and 342, and comparison circuits 313, 323, 333, and 343, respectively.

When the memory device 300 is set to the comparison mode, target data 360 may be transmitted along with a writing operation command via the I/O bus 350. The memory device 300 may store the target data 360 in the latch circuits 312, 322, 332, and 342 included in the plurality of memory banks 310, 320, 330, and 340, respectively. That is, the same target data 360 may be stored in each of the latch circuits 312, 322, 332, and 342.

Thereafter, when address information is transmitted along with a reading operation command via the I/O bus 350, the bank arrays 311, 321, 331, and 341 may output stored data 371, 372, 373, and 374 from addresses included in the address information. The stored data 371, 372, 373 and 374 respectively output from the bank arrays 311, 321, 331, and 341 may be different from each other and may be transmitted to the comparison circuits 313, 323, 333, and 343, respectively.

The comparison circuits 313, 323, 333 and 343 compare the stored data 371, 372, 373 and 374 with the target data 360 stored in the latch circuits 312, 322, 332 and 342 to generate result data 381, 382, 383, and 384, respectively. The result data 381, 382, 383 and 384 may have a size smaller than the target data 360 or the stored data 371, 372, 373 and 374. For example, in a case in which the target data 360 and the stored data 371, 372, 373, and 374 have a size of N bytes, the result data 381, 382, 383, and 384 may have a size of N bits. The memory device 300 may merge the result data 381, 382, 383, and 384 output by the plurality of memory banks 310, 320, 330, and 340 into output data 390 and output the output data 390.

That is, in an example embodiment of the present inventive concept, the plurality of memory banks 310, 320, 330, and 340 simultaneously compare the target data 360 with the stored data 371, 372, 373, and 374 and generate result data 381, 382, 383, and 384, respectively. Therefore, the bank arrays 311, 321, 331, and 341 in which the target data 360 is present and an address in which the target data 360 is stored may be quickly searched.

Figure 11:
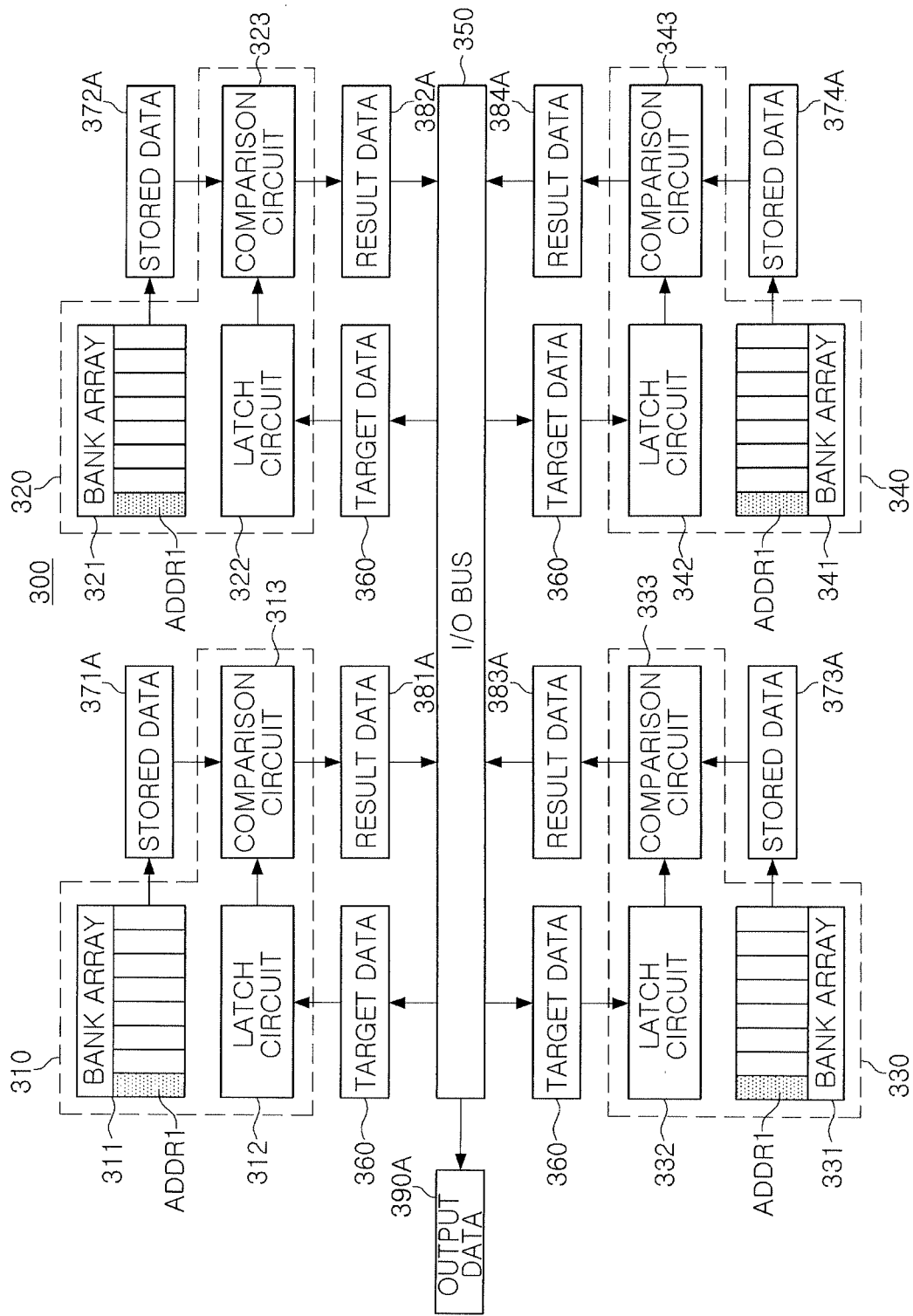
Figure 12:
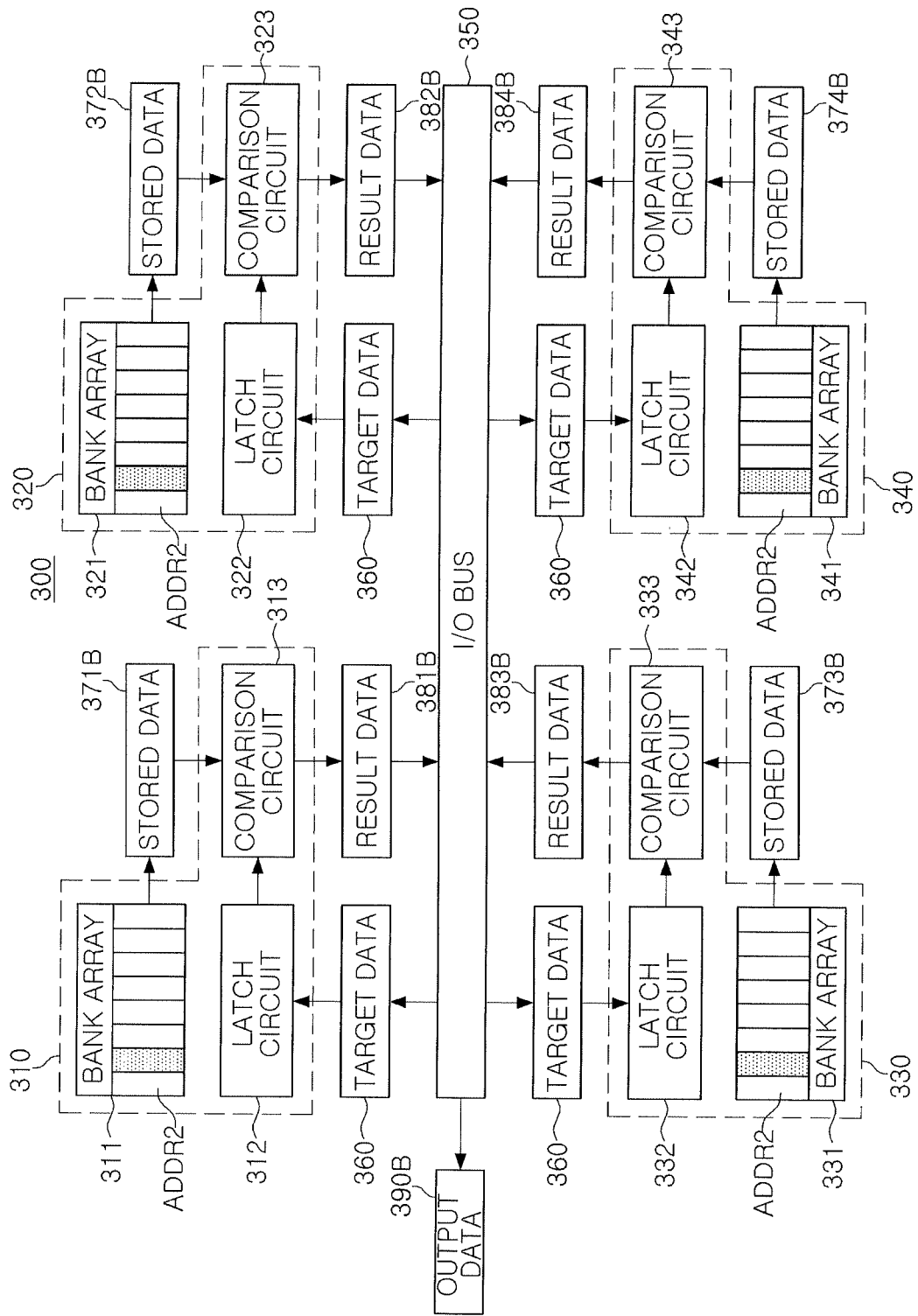

Referring to FIGS. 11 and 12, the memory device 300 may search the bank arrays 311, 321, and 331, and 341 in which the target data 360 is present and an address in which the target data 360 is stored, while changing address in each of the bank arrays 311, 321, 331, and 341. Referring to FIG. 11, the comparison circuits 313, 323, 333 and 343 may compare stored data 371A, 372A, 373A, and 374A output from first addresses ADDR1 of the bank arrays 311, 321, 331, and 341 with the target data 360 to generate result data 381A, 382A, 383A, and 384A, respectively. The memory device 300 may merge the result data 381A, 382A, 383A, 384A into output data 390A and transmit the output data 390A to the processor. Using the output data 390A, the processor may then determine whether the target data 360 is present in the first addresses ADDR1 of the bank arrays 311, 321, 331, and 341.

If the processor determines that the target data 360 exists in first address ADDR1 of any one of the bank arrays 311, 321, 331 and 341, the processor may transfer a mode register set for switching the memory device 300 from the comparison mode to the normal mode, to the memory device 300. Meanwhile, if the processor determines that the target data 360 does not exist in the first addresses ADDR1 of the bank arrays 311, 321, 331, and 341, the processor may transmit a second address ADDR2 for a next comparison operation, together with a reading operation command, to the memory device 300. Alternatively, the address generator included in the memory device 300 may generate the second address ADDR2 by adding an offset to the first address ADDR1, wherein the offset is received previously from the processor, for example, with the first address ADDR1.

Referring to FIG. 12, the comparison circuits 313, 323, 333 and 343 may compare stored data 371B, 372B and 373B output from the second addresses ADDR2 of the bank arrays 311, 321, 331 and 341, with the target data 360 to generate result data 381B, 382B, 383B, and 384B, respectively. The memory device 300 may merge the result data 381B, 382B, 383B, and 384B into output data 390B and transmit the output data 390B to the processor. Using the output data 390B, the processor may determine whether the target data 360 is present in the second addresses ADDR2 of the bank arrays 311, 321, 331, and 341. In response to a command transmitted by the processor on the basis of a determination result, the memory device 300 may continue to perform the comparison operation, or may stop the comparison operation and may be switched from the comparison mode to the normal mode.

Figure 13:
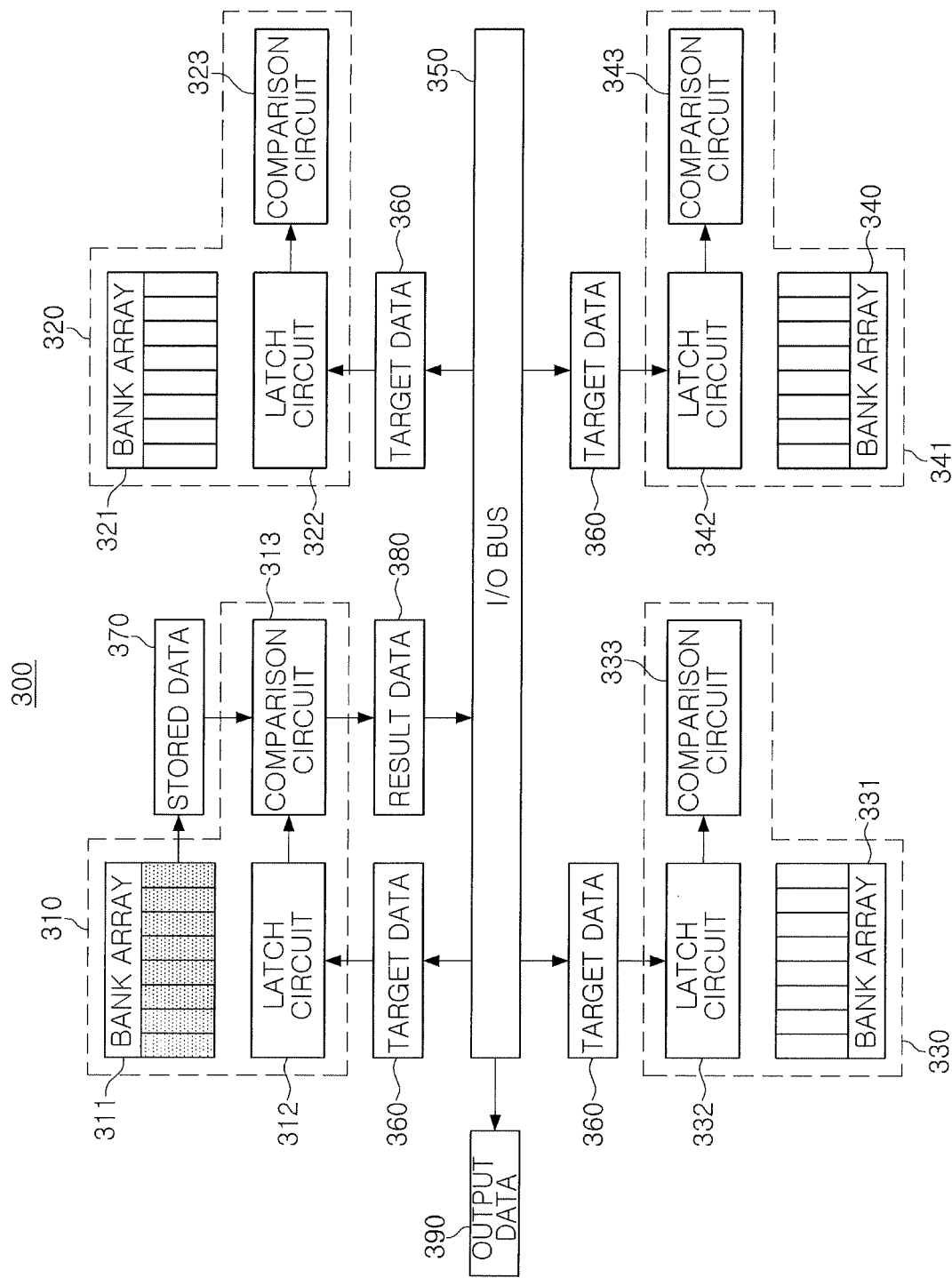

Referring to FIG. 13, the comparison circuit 313 included in one active memory bank 310 may sequentially compare stored data 370 consecutively output from the bank array 311 with target data 360. In an example embodiment illustrated in FIG. 13, the memory device 300 may control the comparison circuit 313 such that output data 390 having a maximum size that can be transmitted via the I/O bus 350 is output.

For example, assuming that the target data 360 and the stored data 370 have a size of 64 bits and the comparison circuit 313 performs a comparison operation on a byte basis, result data 380 may have a size of 8 bits. Thus, the comparison circuit 313 may perform a total of eight comparison operations to transmit the 64-bit output data 390 to the processor via the I/O bus 350. The 64-bit output data 390 may include information regarding whether data corresponding to the target data 360 exists in the stored data 370 of a total of 64 bytes.

Figure 14:
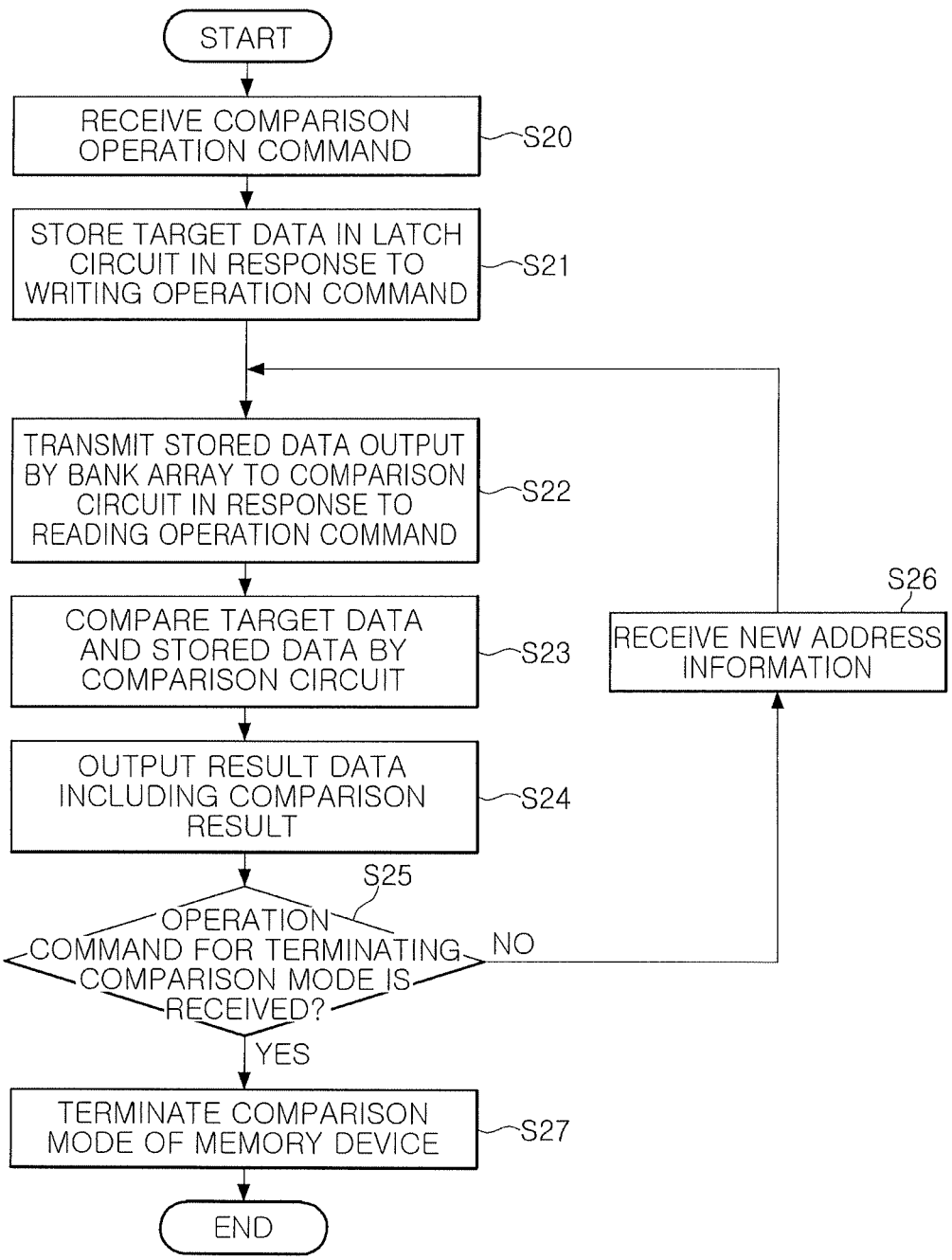
FIG. 14 is a flowchart illustrating an operation of a memory device according to an example embodiment of the present inventive concept.

FIG. 14 is a flowchart illustrating an operation of a memory device according to an example embodiment of the present inventive concept.

Referring to FIG. 14, an operation of the memory device according to an example embodiment of the present inventive concept may begin as the memory device receives a comparison operation command from the processor (S20). The mode register included in the memory device may decode a mode register set transmitted from the processor to execute the comparison operation command, and the memory device may operate in the comparison mode according to the comparison operation command.

When the memory device is operating in the comparison mode, the memory device may store target data transmitted from the processor in the latch circuit, not in the bank array, in response to a writing operation command transmitted from the processor (S21). In an example embodiment, the target data may be data that the processor wants to search for in the memory device.

Next, when the processor transmits a reading operation command, the memory device may transmit stored data output from the bank array to the comparison circuit, in response to the reading operation command (S22). The stored data may be data output by the bank array with reference to an address transmitted together with the reading operation command, and may have the same size as the target data, for example.

The comparison circuit may compare the target data with the stored data (S23) and output result data including a comparison result (S24). In an example embodiment, the comparison circuit may perform XORing by bits, while comparing the target data with the stored data in units of bytes. When the target data and the stored data each have a size of N bytes, the comparison circuit may compare the target data with the stored data by bytes, and generate 0 as a result when the target data matches the stored data, and generate 1 as a result when the target data does not match the stored data, whereby the comparison circuit may generate result data having a size of a total of N bits. The memory device may transmit the result data to the processor. As described above, the memory device may merge the result data from the plurality of memory banks into output data and transmit the output data to the processor.

After outputting the result data to the processor, the memory device may determine whether an operation command for terminating the comparison mode is received from the processor (S25). When an operation command for terminating the comparison mode is not received as a result of the determination (S25), the memory device may receive new address information from the processor (S26) and the bank array may transmit the stored data to the comparison circuit with reference to the new address information (S22).

Meanwhile, when the operation command for terminating the comparison mode is received, the memory device may terminate the comparison mode and operate in the normal mode (S27). In an example embodiment, the processor may determine whether a bank array in which the target data is stored is searched on the basis of the result data output by the memory device (S24). When it is determined that the bank array storing the target data is searched, the processor may transmit an operation command for terminating the comparison mode to the memory device.

Figure 15:
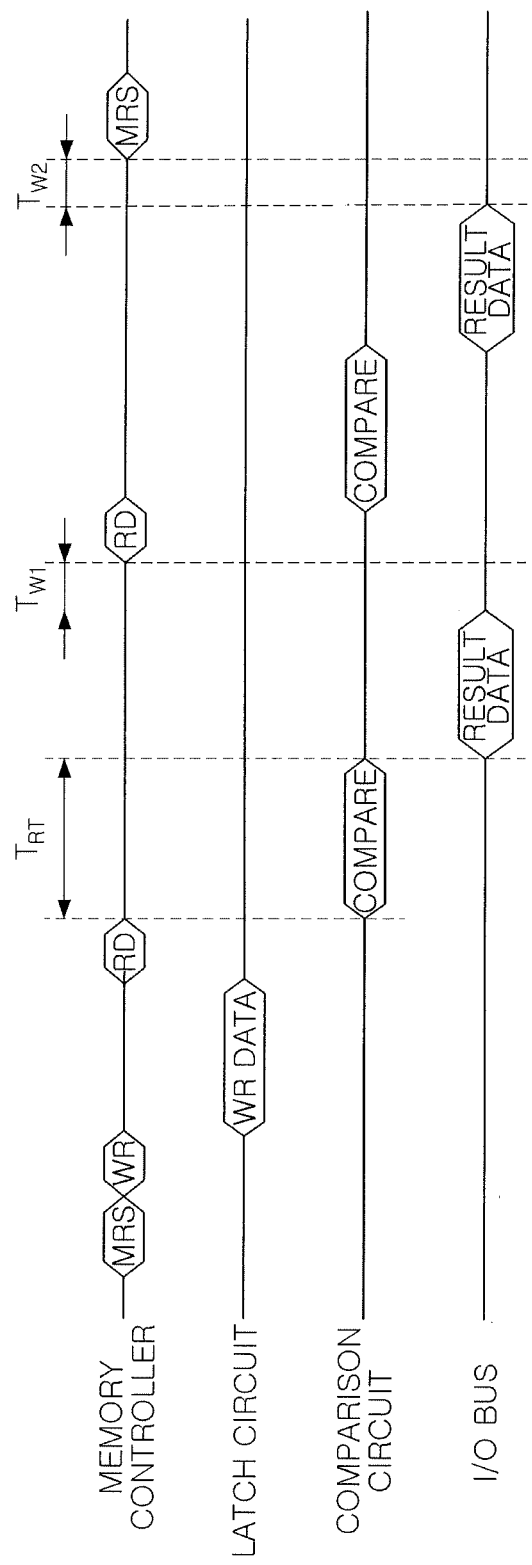
FIG. 15 is a timing diagram illustrating an operation of a memory device according to an example embodiment of the present inventive concept.

FIG. 15 is a timing diagram illustrating operation of a memory device according to an example embodiment of the present inventive concept.

First, a memory controller may receive a mode register set (MRS) from a processor. The mode register set (MRS) received from the processor may include a comparison operation command to switch the memory device to a comparison mode. The memory controller may decode the mode register set to execute the comparison operation command, and accordingly, the memory device may enter the comparison mode.

When the memory device receives a writing operation command WR from the processor while the memory device is operating in the comparison mode, the memory controller may store target data WR DATA in a latch circuit. Meanwhile, when a reading operation command RD is received from the processor, the memory controller may control the bank array to output stored data to a comparison circuit by referring to address information included in a reading operation command RD. The comparison circuit may execute a comparison operation COMPARE to determine whether the stored data output from the bank array matches the target data WR DATA stored in the latch circuit. The comparison operation COMPARE may be executed during read latency TRT.

The comparison circuit generates result data RESULT DATA according to the comparison operation COMPARE and the memory controller may transmit the result data RESULT DATA to the processor via an I/O bus. In an example embodiment, the memory controller may merge the result data RESULT DATA generated by comparison circuits respectively included a plurality of memory banks into output data and transmit the output data to the processor.

The processor may determine whether a bank array storing the target data WR DATA has been found during a first waiting time TW1 using the result data RESULT DATA. If it is determined that the bank array storing the target data has not been found, the memory controller may receive the reading operation command RD again from the processor. The reading operation command RD may contain new address information.

The memory controller may control the bank array to output stored data to the comparison circuit by referring to the new address information included in the reading operation command RD. The comparison circuit may execute a comparison operation COMPARE to determine whether the stored data output from the bank array matches the target data WR DATA stored in the latch circuit. The comparison circuit may generate result data RESULT DATA according to the comparison operation COMPARE and the memory controller may transmit the result data RESULT DATA to the processor via the I/O bus.

The processor may determine whether a bank array storing the target data WR DATA has been searched during a second waiting time TW2 on the basis of the result data RESULT DATA. If it is determined that the bank array storing the target data has been searched, the memory controller may receive a mode register set (MRS) including an operation command for terminating the comparison mode of the memory device from the processor. The memory controller may switch the operation mode of the memory device from the comparison mode to the normal mode on the basis of the mode register set (MRS).

Figure 16:
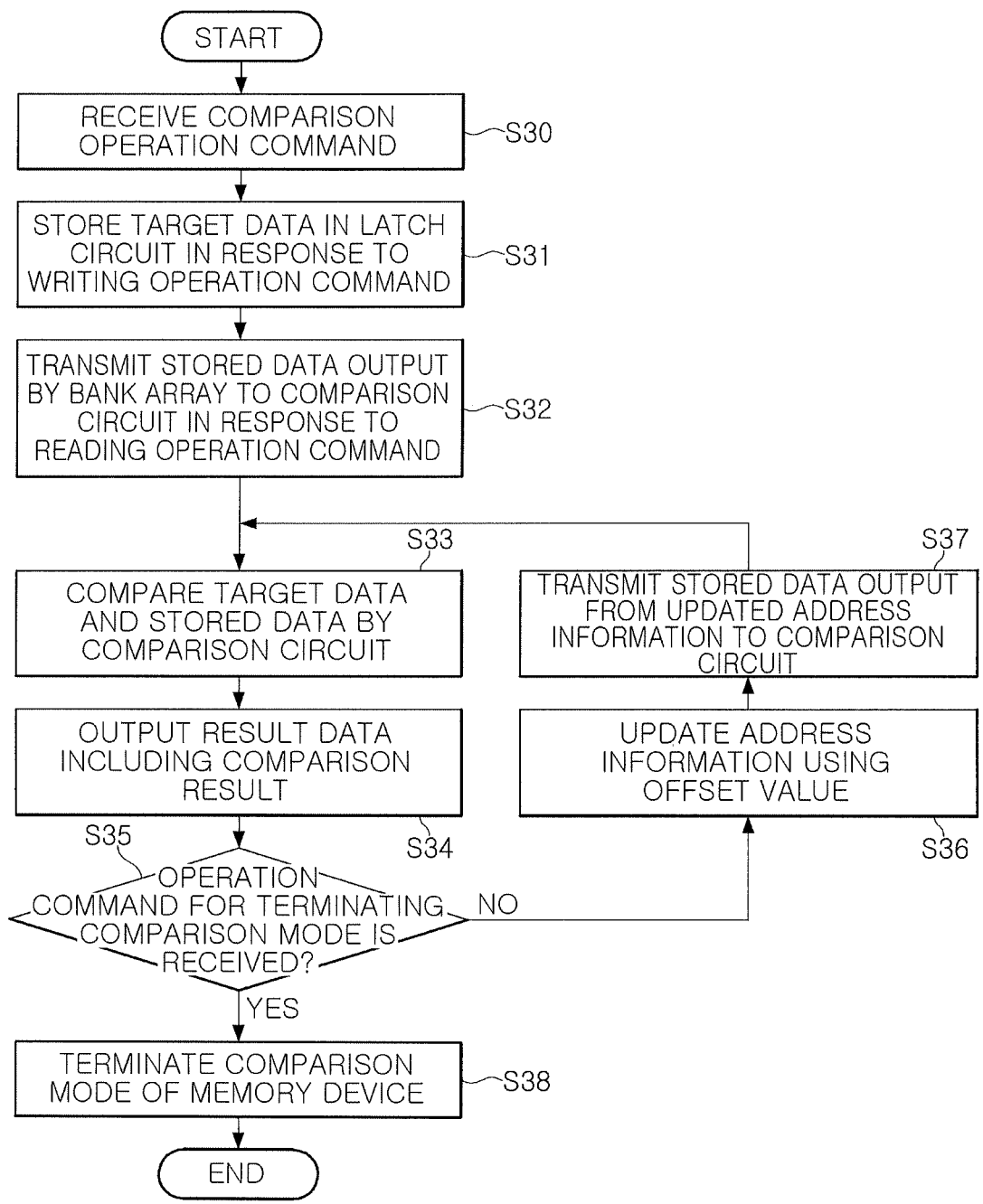
FIG. 16 is a flowchart illustrating an operation of a memory device according to an example embodiment of the present inventive concept.

FIG. 16 is a flowchart illustrating an operation of a memory device according to an example embodiment of the present inventive concept.

Referring to FIG. 16, an operation of the memory device according to an example embodiment of the present inventive concept may begin as the memory device receives a comparison operation command from a processor (S30). A mode register included in the memory device may decode a mode register set transmitted by the processor to execute a comparison operation command and the memory device may operate in the comparison mode according to the comparison operation command.

When the memory device is operating in the comparison mode, the memory device may store target data transmitted from the processor in a latch circuit, rather than in a bank array, in response to the writing operation command transmitted from the processor (S31). In an example embodiment, the target data may be data that the processor wants to search for in the memory device.

Next, when the processor transmits a reading operation command, the memory device may transmit stored data output by the bank array to the comparison circuit in response (S32). The stored data is data output by the bank array with reference to the address transmitted together with the reading operation command and may have the same size as the target data, for example.

The comparison circuit may compare the target data with the stored data (S33) and output result data including a comparison result (S34). In an example embodiment, the comparison circuit may perform XORing of bits, while comparing the target data with the stored data in units of bytes. After outputting the result data to the processor, the memory device may determine whether an operation command for terminating the comparison mode is received from the processor (S35).

If it is determined that the operation command for terminating the comparison mode is not received as a result of the determination in the step of S35, the memory device may update the address information using an offset value (S36). In an example embodiment, the address information may be updated by an address generator included in the memory controller, and the offset value may be a value transmitted by the processor together with the reading operation command in the step of S32. For example, the address generator may update the address information by adding the offset value to the address to which the bank array outputs the stored data in the step of S32.

The memory device may transmit the stored data output by the bank array to the comparison circuit with reference to the updated address information (S37). The comparison circuit may compare the stored data output from the updated address information by the bank array with the target data (S33) and output result data including a comparison result (S34).

Meanwhile, when the operation command for terminating the comparison mode is received in the step of S35, the memory device may terminate the comparison mode and operate in the normal mode (S38). In the example embodiment illustrated in FIG. 16, the memory device may consecutively generate and output result data by comparing the stored data with the target data, while updating the address information by itself using the offset value, until the operation command for terminating the comparison mode is received from the processor.

Figure 17:
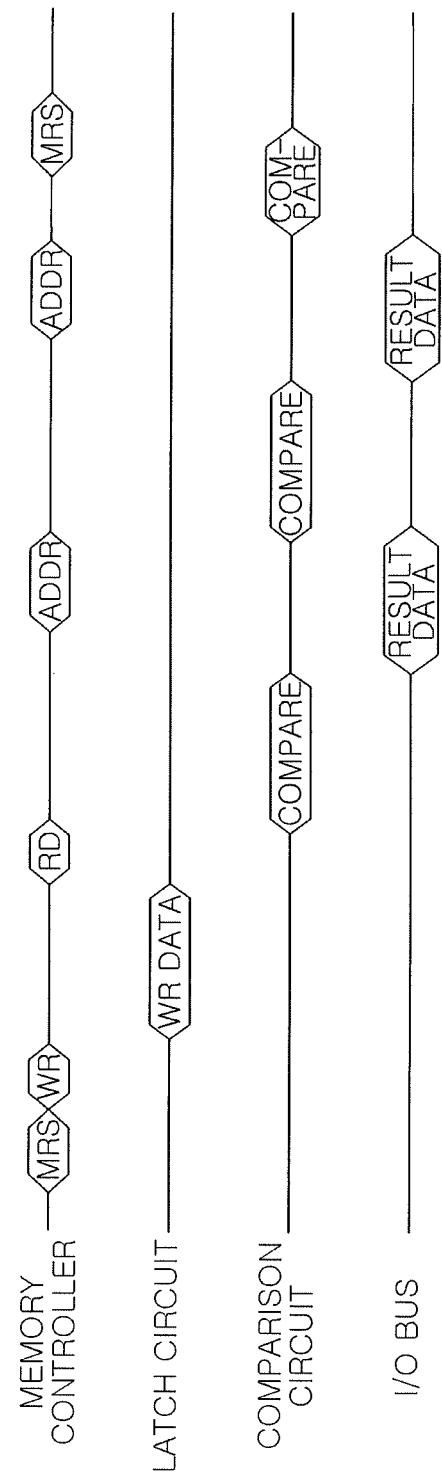
FIG. 17 is a timing diagram illustrating an operation of a memory device according to an example embodiment of the present inventive concept.

FIG. 17 is a timing diagram provided to illustrate an operation of a memory device according to an example embodiment of the present inventive concept.

First, a memory controller may receive a mode register set (MRS) from a processor. The mode register set (MRS) received from the processor may include a comparison operation command to switch the memory device to a comparison mode. The memory controller may decode the mode register set to execute the comparison operation command, and accordingly, the memory device may be switched to the comparison mode.

When the memory device receives a writing operation command WR from the processor while the memory device is operating in the comparison mode, the memory controller may store target data WR DATA in a latch circuit. Meanwhile, when a reading operation command RD is received from the processor, the memory controller may control the bank array to output stored data to a comparison circuit by referring to address information included in a reading operation command RD. The comparison circuit may execute a comparison operation COMPARE to determine whether the stored data output from the bank array matches the target data WR DATA stored in the latch circuit.

The comparison circuit generates result data RESULT DATA according to the comparison operation COMPARE and the memory controller may transmit the result data RESULT DATA to the processor via an I/O bus. In an example embodiment, the memory controller may merge the result data RESULT DATA generated by comparison circuits respectively included a plurality of memory banks into output data and transmit the merged result data to the processor.

The memory controller may transmit the result data RESULT DATA to the processor via the I/O bus and generate new address information ADDR using the offset value received together with the reading operation command RD. The new address information ADDR may be generated by adding the offset value to the address information received together with the reading operation command RD. When the new address information ADDR is generated, the memory controller may control the bank array to output the stored data to the comparison circuit by referring to the new address information. The comparison circuit may execute a comparison operation COMPARE to determine whether the stored data and the target data WR DATA match and generate the result data RESULT DATA.

In the example embodiment illustrated in FIG. 17, the comparison operation COMPARE may be consecutively executed until the operation command for terminating the comparison mode is received. As illustrated in FIG. 17, when a mode register set (MRS) including the operation command for terminating the comparison mode is received from the processor, the comparison operation COMPARE being executed is terminated and the memory device may be switched from the comparison mode to the normal mode.

Meanwhile, in another example embodiment of the present inventive concept, the memory device may receive additional information through separate input pins. In an example embodiment, the memory device may receive information regarding whether data received along with a writing operation command WR is to be simultaneously stored in the latch circuits of the respective memory banks or to be sequentially stored in the latch circuits of the respective memory banks, via the separate input pins. Further, the memory device may receive information indicating a data source which has transmitted the received data together with the writing operation command WR through the separate input pins. Therefore, in a case in which the data source which has transmitted the data together with the writing operation command WR is designated as the processor, the memory device may determine that the data received together with the writing operation command WR is the target data WR DATA.

Meanwhile, the memory device may receive additional information together with the reading operation command RD. For example, the additional information received by the memory device together with the reading operation command RD may designate whether all the bank arrays should simultaneously output the stored data and transfer the same to the latch circuit or whether the bank arrays should sequentially output the stored data and transfer the same to the latch circuits. Since, in the reading operation command RD, the data transferred to the latch circuit is stored data output from the bank array, the data source may be indicated by the bank array in the information indicating the data source. The writing operation command WR and the reading operation command RD according to various example embodiments of the present inventive concept are illustrated in Table 1 below.

TABLE 1

| Command | Bank Information | Address Information | Data source |
|---|---|---|---|
| WR_AB | Not applied | Not applied | Processor |
| WR_PB | Designate memory bank to store target data | Not applied | Processor |
| RD_AB | Not applied | Designate address to read stored data | Bank array |
| RD_PB | Designate memory bank to read stored data | Designate address to read stored data | Bank array |

Referring to Table 1, in response to a first writing operation command WR_AB, the memory device may simultaneously store target data WR DATA received from the processor in the latch circuits of all the memory banks. Since the target data WR DATA is stored in the latch circuits and operations are simultaneously executed in all the memory banks, bank information and address information may not be separately received. Meanwhile, by the second writing operation command WR_PB, the target data WR DATA may be stored in at least some of the memory banks. Since the target data WR DATA, like the first writing operation command WR_AB, is stored in the latch circuits, separate address information may not be received. Meanwhile, since a memory bank to store the target data WR DATA is to be designated, the memory device may separately receive bank information together with the second writing operation command WR_PB.

Meanwhile, in response to the first reading operation command RD_AB, the memory device may control all the memory banks to read the stored data from the bank arrays and store the same in the latch circuits, respectively. Here, since the address to read the stored data in the bank arrays must be designated, the memory device may receive address information together with the first reading operation command RD_AB. Also, in an example embodiment, in response to a second reading operation command RD_PB, the memory device may control at least some of the memory banks to read stored data from the bank arrays and store the stored data in the latch circuits. The memory device may receive address information designating an address of a bank array from which the stored data is to be read and bank information designating a memory bank to perform a reading operation.

Figure 18:
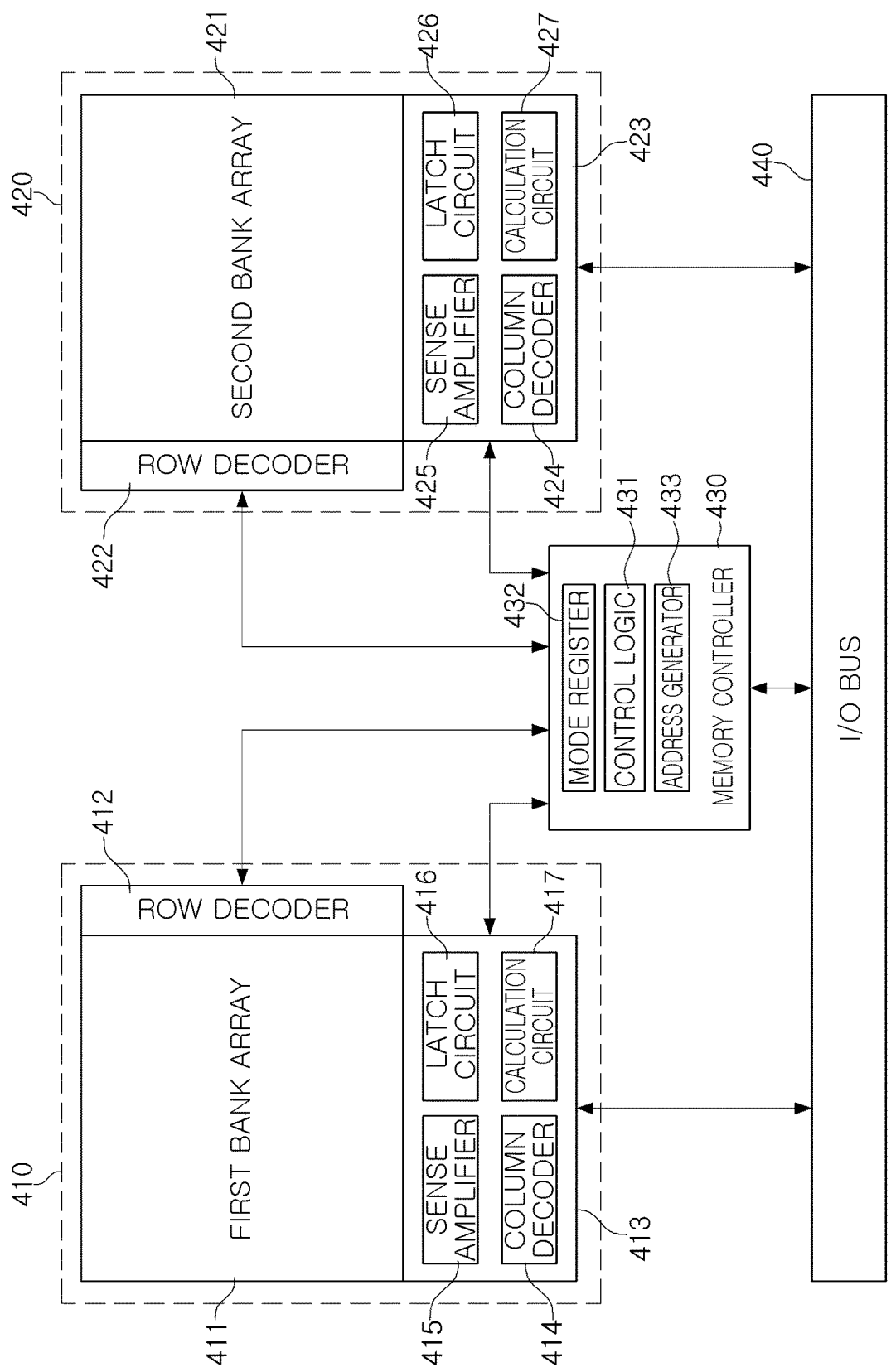
FIG. 18 is a block diagram schematically illustrating a memory device according to an example embodiment of the present inventive concept.

FIG. 18 is a block diagram schematically illustrating a memory device according to an example embodiment of the present inventive concept.

Referring to FIG. 18, a memory device 400 according to an example embodiment of the present inventive concept may include a plurality of memory banks 410 and 420, a memory controller 430, and an I/O bus 440. The first memory bank 410 and the second memory bank 420 may share the I/O bus 440 and may have the same structure.

Referring to the first memory bank 410 as an example, the first memory bank 410 may include a first bank array 411 having a plurality of memory cells for storing data, a row decoder 412, and a write/read circuit 413. The read/write circuit 413 may include a column decoder 414, a sense amplifier 415, a latch circuit 416, and a calculation circuit 417. The calculation circuit 417 may include a circuit for performing a predetermined calculation, such as an adder, a multiplier, or the like.

The memory controller 430 may include a control logic 431, a mode register 432, an address generator 433, and the like. The control logic 431 may control an operation of the mode register 432, the address generator 433, the first memory bank 410, and the second memory bank 420.

When a mode register set is received via the I/O bus 440, the mode register 432 may decode the mode register set to set an operation mode of the memory device 400. In one example, when a mode register set including a calculation operation command is received, the mode register 432 may set the operation mode of the memory device 400 to a calculation mode. In the calculation mode, the latch circuits 416 and 426 and the calculation circuits 417 and 427 may be activated.

For example, in a case in which the calculation circuits 417 and 427 include an adder, a predetermined value may be collectively added to at least some of data respectively stored in the first bank array 411 and the second bank array 421 by operating the memory device 400 in the calculation mode. When the memory device 400 receives a writing operation command in the calculation mode, the memory controller 430 may store addition data transmitted together with the writing operation command in the latch circuits 416 and 426.

Thereafter, when the memory device 400 receives a reading operation command including address information, stored data respectively output from the first bank array 411 and the second bank array 421 may be transmitted to the calculation circuits 417 and 427 with reference to the corresponding address information, respectively.

The calculation circuits 417 and 427 may add the addition data stored in the latch circuits 416 and 426 to the stored data to perform an addition operation and store a result value of the addition operation in the first bank array 411 and the second bank array 421. Selectively, the memory controller 430 may update the address information via the address generator 433 or receive new address information from the processor to repeatedly perform the addition operation.

In this manner, since the calculation circuits 417 and 427 capable of performing calculation such as addition or multiplication and the latch circuits 416 and 427 capable of storing data are provided in the plurality of memory banks 410 and 420, respectively, it is possible to process the calculation, which is frequently executed in the memory device 400, in the memory device 400 rather than in the processor. According to an example embodiment of the present inventive concept, since the calculation operation can be simultaneously performed in each of the plurality of memory banks 410 and 420, a calculation speed may be increased to enhance performance of the memory device.

According to an example embodiment of the present inventive concept, when the memory device is set to the comparison mode, the target data is stored in the latch circuit and the comparison circuit may compare the stored data read from the bank array with the target data and transmit result data to the processor. Thus, since the result data generated by the plurality of memory banks or the result data generated by performing the comparison operation a plurality of times in one memory bank are merged and output, an operation speed of the memory device may be improved.

Various advantages and beneficial effects of the present disclosure are not limited to the above contents and will be more easily understood in the course of describing the specific embodiments of the present disclosure.

While example embodiments have been shown and described above, it will be apparent to those skilled in the art that modifications and variations could be made without departing from the scope of the present inventive concept as defined by the appended claims.

What is claimed:

1. A memory device comprising:
   a plurality of memory banks coupled to an input/output bus; and
   a memory controller, coupled to the plurality of memory banks, the memory controller configured to control operations of the plurality of memory banks,
   wherein each of the plurality of memory banks comprises:
     a bank array comprising a plurality of memory cells configured to store data;
     a latch circuit, coupled to the input/output bus, the latch circuit configured to store target data received via the input/output bus to provide stored target data; and
     a comparison circuit, coupled to the latch circuit, the comparison circuit configured to compare stored data output by the bank array with the stored target data to provide result data to the memory controller,
   wherein the memory controller comprises a mode register configured to activate the latch circuit and the comparison circuit in response to receiving a comparison operation command from a processor external to the memory device.

2. The memory device of claim 1, wherein the latch circuit and the comparison circuit are coupled to a data transmission path coupled to the bank array and the input/output bus.

3. The memory device of claim 2, wherein each of the plurality of memory banks further comprises a multiplexer circuit configured to direct the target data to the latch circuit via the data transmission path, in response to a command from the memory controller.

4. The memory device of claim 1, wherein
   the stored target data is structured according to a burst size of the plurality of memory banks.

5. The memory device of claim 1, wherein
   the memory controller is configured to merge respective result data from each of the plurality of memory banks to provide output data to the input/output bus.

6. The memory device of claim 1, wherein
   wherein the comparison circuit is configured to compare a generate a plurality of pieces of a plurality of stored data output from different addresses of the bank array to the stored target data to generate a plurality of pieces of result data, and
   wherein the memory controller is configured to merge the plurality of pieces of result data to provide output data.

7. The memory device of claim 1, wherein the comparison circuit comprises a plurality of XOR circuits configured to XOR the stored target data with the stored data on a per bit basis to provide the result data.

8. The memory device of claim 1, wherein each of the stored target data and the stored data includes N bytes (N is a natural number), and the result data includes N bits.

9. The memory device of claim 1, wherein the memory controller is configured to use to the result data to determine whether the stored data from a memory bank matches the stored target data.

10. The memory device of claim 9, wherein the memory controller is further configured to output information identifying the memory bank and address information of the bank array that comprises the stored data in response to determining that the stored data from the memory bank matches the stored target data.

11. The memory device of claim 9, wherein the memory controller is further configured to control the plurality of memory banks such that the stored data is output from another address of the bank array in response to determining that the stored data from the memory bank does not match the stored target data.

12. The memory device of claim 11, wherein the memory controller further comprises:
    an address generator configured to change an address of the bank array providing the stored data in response to determining that the stored data from the memory bank does not match the stored target data.

13. The memory device of claim 1, wherein the mode register is configured to generate a write command to store the target data in the latch circuit rather than in the bank array responsive to receiving the comparison operation command and to generate a read command so that the comparison circuit receives the stored data output from the bank array to compare the stored data with the stored target data.

14. The memory device of claim 13, wherein the memory controller is configured to control the plurality of memory banks to sequentially perform a writing operation according to the write command and a reading operation according to the read command.

15. The memory device of claim 14, wherein when the stored target data and the stored data do not match, the memory controller is configured to control the plurality of memory banks to perform subsequent reading operation to a sequence of addresses of the bank array.

16. The memory device of claim 1, wherein the comparison circuit is configured to compare the stored target data to the stored data during a read latency time of a memory bank.

17. A memory device comprising:
    a plurality of memory banks coupled to an input/output bus, wherein each of the plurality of memory banks comprises:
      a respective bank array having a plurality of memory cells;
      a latch circuit configured to store stored target data; and
      a comparison circuit, coupled to the latch circuit and to a data transmission path of the bank array, the memory device further comprising:
    a memory controller configured to perform a writing operation to store target data in the plurality of memory banks and configured to perform a reading operation to retrieve stored data from the plurality of memory banks in response to a comparison operation command transmitted from an external processor, wherein the memory controller is further configured to control the plurality of memory banks such that the latch circuit stores the stored target data in response to the writing operation and is configured to cause the stored data to be compared to the stored target data in the memory controller in response to the comparison operation command transmitted from the external processor to generate result data,
    wherein the memory controller is further configured to switch an operation mode of the memory device between a normal mode and a comparison mode, and deactivate the latch circuit and the comparison circuit in the normal mode.

18. The memory device of claim 17, wherein
    the memory controller is configured to sequentially perform the writing operation and the reading operation in response to the comparison operation command transmitted from the external processor, and
    when the stored target data and the stored data do not match, the memory controller is configured to perform subsequent reading operations to a sequence of addresses of the bank array.

19. A memory device comprising:
a plurality of memory banks coupled to an input/output bus, each of the plurality of memory banks comprises:
  a bank array comprising a plurality of memory cells;
  a data transmission path coupled to the bank array;
  a latch circuit coupled to the data transmission path; and
  a comparison circuit coupled to the data transmission path, the memory device further comprising:
a memory controller configured to control the plurality of memory banks, in response to a comparison operation command and target data received from an external processor, to perform a writing operation simultaneously to the plurality of memory banks to store the target data in each latch circuit and to perform a reading operation to the plurality of memory banks to compare respective stored data retrieved from the bank array to the target data stored in the latch circuit to generate result data,
wherein the memory controller is further configured to switch an operation mode of the memory device between a normal mode and a comparison mode, and deactivate the latch circuit and the comparison circuit in the normal mode.

* * * * *